US008525276B2

(12) United States Patent
Tchertchian et al.

(10) Patent No.: US 8,525,276 B2
(45) Date of Patent: Sep. 3, 2013

(54) HYBRID PLASMA-SEMICONDUCTOR ELECTRONIC AND OPTICAL DEVICES

(75) Inventors: Paul A. Tchertchian, Mission Viejo, CA (US); Clark J. Wagner, Urbana, IL (US); J. Gary Eden, Champaign, IL (US)

(73) Assignee: The Board of Trustees of the University of California, Urbana, IL (US)

( * ) Notice: Subject to any disclaimer, the term of this patent is extended or adjusted under 35 U.S.C. 154(b) by 282 days.

(21) Appl. No.: 12/817,551

(22) Filed: Jun. 17, 2010

(65) Prior Publication Data

US 2011/0037102 A1    Feb. 17, 2011

Related U.S. Application Data

(60) Provisional application No. 61/187,842, filed on Jun. 17, 2009.

(51) Int. Cl.
*H01L 27/14* (2006.01)

(52) U.S. Cl.
USPC .................. 257/414; 438/48; 257/E29.242

(58) Field of Classification Search
USPC .................. 257/414–470, 564; 438/48–98
See application file for complete search history.

(56) References Cited

U.S. PATENT DOCUMENTS

| | | | |
|---|---|---|---|
| 4,683,399 A | 7/1987 | Soclof | |
| 5,765,073 A | 6/1998 | Schoenbach et al. | |
| 6,016,027 A | 1/2000 | DeTemple et al. | |
| 6,139,384 A | 10/2000 | DeTemple et al. | |
| 6,194,833 B1 | 2/2001 | DeTemple et al. | |
| 6,815,891 B2 | 11/2004 | Eden et al. | |
| 6,970,219 B1 | 11/2005 | Hermann | |
| 7,112,918 B2 | 9/2006 | Eden et al. | |
| 2003/0080664 A1* | 5/2003 | Eden et al. | 313/356 |
| 2005/0253290 A1 | 11/2005 | Yokoyama et al. | |
| 2006/0082319 A1 | 4/2006 | Eden et al. | |
| 2009/0283796 A1* | 11/2009 | Udrea et al. | 257/139 |
| 2010/0289413 A1 | 11/2010 | Eden et al. | |

FOREIGN PATENT DOCUMENTS

WO   WO 2007/087371   8/2007

OTHER PUBLICATIONS

Chen, K.-F., et.al., "The plasma transistor: A microcavity plasma device coupled with a low voltage, controllable electron emitter", *Applied Physics Letters*, 93, 161501, 2008.

(Continued)

*Primary Examiner* — Julio J Maldonado
*Assistant Examiner* — Sonya D McCall Shepard
(74) *Attorney, Agent, or Firm* — Greer, Burns & Crain Ltd.

(57) ABSTRACT

The invention provides combination semiconductor and plasma devices, including transistors and phototransistors. A preferred embodiment hybrid plasma semiconductor device has active solid state semiconductor regions; and a plasma generated in proximity to the active solid state semiconductor regions. Devices of the invention are referred to as hybrid plasma-semiconductor devices, in which a plasma, preferably a microplasma, cooperates with conventional solid state semiconductor device regions to influence or perform a semiconducting function, such as that provided by a transistor. The invention provides a family of hybrid plasma electronic/photonic devices having properties previously unavailable. In transistor devices of the invention, a low temperature, glow discharge is integral to the hybrid transistor. Example preferred devices include hybrid BJT and MOSFET devices.

22 Claims, 25 Drawing Sheets

(56) References Cited

OTHER PUBLICATIONS

Eden, J. Gary, et. al., "Microplasma Channels and Large Arrays: Applications to Photomedicine, Microlasers, and Reactors on a Chip", *Final Report on AFOSR Grant No. FA9550-07-1-0003*, Sep. 29, 2006-Sep. 30, 2009, Oct. 2009.

Park, S.-J., et. al., "Flexible microdischarge arrays: Metal/polymer devices", *Applied Physics Letters*, vol. 77. No. 2, Jul. 10, 2000.

Park, S.-J., et. al., "Arrays of microdischarge devices having 50-100 μm square pyramidal Si anodes and screen cathodes", *Electronics Letters*, vol. 37, No. 3, Feb. 1, 2001.

PHYSORG.com, "Scientist fabricate first plasma transistor", www.physorg.com/news145705715.html, Nov. 12, 2008.

SCIENCEDAILY, "New Plasma Transistor Could Create Sharper Displays", http://www.sciencedaily.com/releases/2009/02/090204131617.htm, Feb. 17, 2009.

Tarighat, Roohollah, S., et. al., "Realization of Flexible Plasma Display Panels on PET Substrates", *Proceeding of the IEEE*, vol. 93, No. 7, Jul. 2005.

\* cited by examiner

US 8,525,276 B2

HYBRID PLASMA-SEMICONDUCTOR ELECTRONIC AND OPTICAL DEVICES

PRIORITY CLAIM AND REFERENCE TO RELATED APPLICATION

This application claims priority pursuant to 35 U.S.C. §119 from prior provisional application Ser. No. 61/187,842, which was filed on Jun. 17, 2009 and entitled Hybrid Plasma-Semiconductor Transistors.

STATEMENT OF GOVERNMENT INTEREST

This invention was made with government support under Grant No. FA-9550-07-1-0003 awarded by the United States Air Force Office of Scientific Research. The government has certain rights in the invention.

FIELD

Fields of the invention include microplasma and macroplasma generation. Applications of the invention include semiconductor devices, optoelectronics, photonics, microelectronics, and plasma electronics.

BACKGROUND

Modern electronics rely on solid state materials and solid state semiconductors, in particular. However, plasma-based electronic devices assumed a significant role in communications and display systems in the first half of the 20$^{th}$ century. Vacuum tubes were previously used to amplify and switch signals, but have been largely replaced by solid state devices. Vacuum tubes continue, however, to be employed in specialized applications such as in the final amplifier of high power radio transmitters.

Macroplasma devices have also been used in older communications and display systems. One example is the plasma electron tube (such as the OA, OB, OC, and OD series of rare gas-plasma voltage regulators) that was widely incorporated into audio equipment as well as the power supplies of RF transmitters and receivers. Other examples include plasma switches and the 866A and 872 mercury plasma high voltage rectifiers that found application in early RF transmitters. Another example is the Nixie tube, a neon plasma based device that was an essential component of alphanumeric displays for a number of decades in the twentieth century.

Subsequent applications of plasmas to electronics or displays have often required imposing external voltages or magnetic fields so as to influence the electromagnetic field distribution in the plasma. For example, U.S. Pat. No. 5,765,073 discloses a field controlled plasma discharge display element serving as a light source element in plasma discharge electrostatic printers. The display element includes a pair of discharge electrodes and a third electrode positioned external and proximate to the discharge electrodes for the purpose of generating a control electric field. This control electric field is able to vary the intensity of the plasma discharge and its spatial distribution by distorting the shape of the discharge electric field. In this and other similar devices, a degree of control over the properties of a plasma is exerted by an auxiliary device or structure, where "auxiliary" indicates that the added device or structure is not required for sustenance of the plasma. Soclof U.S. Pat. No. 4,683,399 summarizes typical prior devices that inject electrons into vacuum with a reverse-biased pn junction, and subsequently accelerate and collect the electrons with an anode.

SUMMARY OF THE INVENTION

The invention provides combination semiconductor and plasma devices, including transistors and phototransistors. A preferred embodiment hybrid plasma semiconductor device has at least one active solid state semiconductor region; and a plasma generated in proximity to the active solid state semiconductor region(s). Devices of the invention are referred to as hybrid plasma-semiconductor devices, in which a plasma, preferably a microplasma, cooperates with conventional solid state semiconductor device regions to influence or perform a semiconducting function, such as that provided by a transistor. The invention provides a family of hybrid plasma electronic/photonic devices having properties previously unavailable. In transistor devices of the invention, a low temperature, glow discharge is integral to the hybrid transistor, serving as the collector of the transistor. Example preferred devices include hybrid BJT and MOSFET devices.

DETAILED DESCRIPTION OF THE PREFERRED EMBODIMENTS

Figure 1:
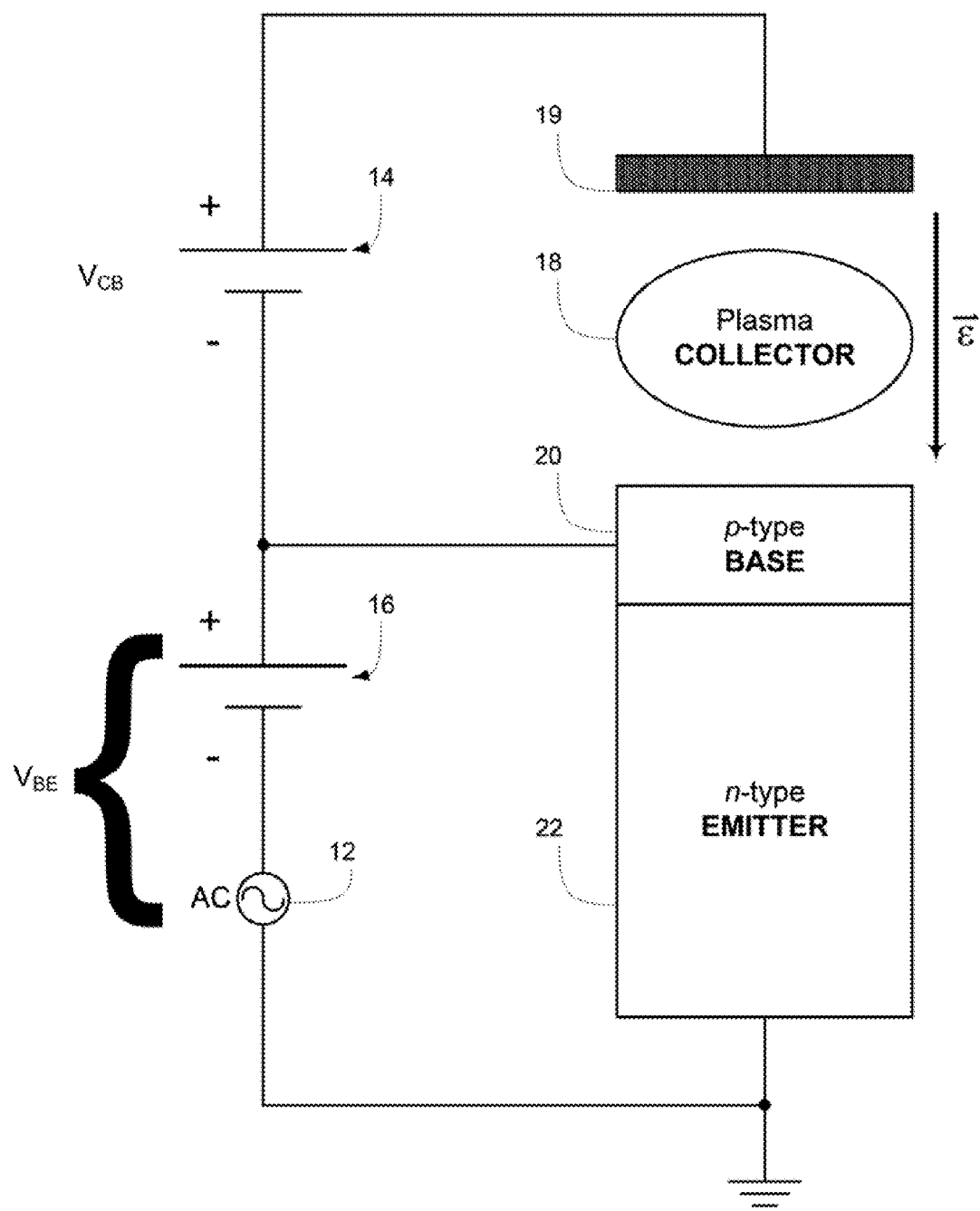
FIG. 1 is a schematic diagram of a preferred embodiment npn hybrid plasma semiconductor bipolar junction transistor in a simple external circuit.

The invention provides combination semiconductor and plasma devices, including transistors and phototransistors. Devices of the invention are referred to as hybrid plasma-semiconductor devices, in which a plasma, preferably a microplasma, cooperates with conventional solid state semiconductor device regions to influence or perform a semiconducting function, such as that provided by a transistor. The plasma can perform or influence electronic or photonic semiconducting functions. The invention provides a family of hybrid plasma electronic/photonic devices having properties believed to be previously unavailable. In transistor devices of the invention, a low temperature, glow discharge is integral to the hybrid transistor. Example preferred devices include hybrid BJT and MOSFET devices.

A preferred embodiment hybrid plasma semiconductor device has at least one active solid state semiconductor region; and a plasma generated in proximity to the active solid state semiconductor region(s).

An embodiment of the invention is a hybrid plasma-semiconductor device that has doped solid state semiconductor regions in a solid state substrate, and at least one electrode arranged with respect to the solid state substrate to generate a plasma proximate the substrate and the solid state semiconductor regions in a position where the plasma will influence or perform a semiconducting function in cooperation with the solid state semiconductor regions.

An embodiment of the invention is a hybrid plasma semiconducting device having a plurality of active semiconductor regions, at least one of the active regions being a plasma or being influenced by a plasma, and at least one of the other of the plurality of active semiconductor regions being formed by solid state semiconductor material.

In a preferred embodiment, a device includes n, p, and n regions with at least one of the n, p and n regions being formed by a plasma and at least one other one of the n, p and n regions being a solid state semiconductor material.

In preferred embodiments, the plasma comprises a microplasma formed in a microcavity. A preferred embodiment device includes a pn junction formed from first and second solid state semiconductor materials and a plasma generated in proximity to the pn junction. A preferred embodiment transistor is a bipolar junction transistor having an n-type silicon substrate. A microcavity penetrates the silicon substrate. Thin p-type solid state material is disposed between the microcavity and the n-type silicon substrate.

A preferred embodiment semiconducting microcavity plasma device includes a MOSFET formed in semiconductor materials, and a microcavity disposed with respect to the MOSFET to ignite a microplasma in the microcavity during MOSFET operation. The microplasma ignited in the microcavity can act as a gate of the MOSFET to control a conduction channel between the source and drain regions.

Preferred embodiments of the invention provide hybrid plasma/semiconductor transistors in which the plasma replaces at least one semiconductor portion of a conventional bipolar junction transistor. Preferred embodiments of the invention provide a plasma bipolar junction transistor (PBJT) in which a plasma serves as the collector for an npn BJT. As the plasma conducts current, light is emitted that can be modulated by imposing a time-varying voltage across the emitter-base junction of the PBJT. In this and other devices of the invention, the plasma can be either a microcavity plasma, offering reduced volume and enhanced electron densities relative to a macroscopic plasma, or a larger volume (conventional) low temperature plasma. Other preferred embodiments of the invention provide plasma MOSFET devices in which a plasma controls the conductance of the channel in a MOSFET.

Preferred embodiments of the invention provide hybrid plasma semiconductor electronic/photonic devices in which semiconductor pn junctions generate, or control the properties of, plasma. The plasma replaces at least one semiconductor portion of a conventional transistor—the plasma is an integral part of the transistor. Preferred embodiments of the invention provide a plasma bipolar junction transistor (PBJT) in which a plasma serves as the collector (and/or emitter) for an npn BJT. Light emitted by the plasma collector can be modulated by applying a time-varying voltage across the emitter-base junction. In this and other devices of the invention, the plasma can be a microcavity plasma that offers reduced volume and enhanced electron densities relative to a macroscopic plasma. Alternatively, the plasma can be macroscopic in volume. Other preferred embodiments of the invention provide plasma MOSFET devices in which a plasma serves as the gate, controlling the conductance of the channel in a MOSFET.

Hybrid plasma semiconductor devices of the invention can be fabricated by methods of the invention using known fabrication steps that have been developed by the VLSI and MEMS communities. Devices of the invention can be fabricated in different semiconductor material systems, while preferred embodiment semiconducting microcavity devices are fabricated in silicon. In preferred applications of the invention, hybrid semiconductor-microcavity plasma devices provide a foundation for a new generation of ultrahigh resolution plasma displays. The integration of preferred plasma semiconductor devices of the invention, fabricated in silicon, with electronic systems already available in silicon forms a foundation for high resolution displays, biomedical and environmental sensors, and micro-analytical instruments having low power consumption. Devices of the invention are also suitable for high power applications, such as high power transistors used in wide area network base stations.

Preferred embodiments of the invention will now be discussed with respect to the drawings. The drawings include schematic representations that will be understood by artisans in view of the general knowledge in the art of the description that follows. Features can be exaggerated in the drawings for emphasis, and features may not be to scale. Artisans will recognize broader aspects of the invention from the description of the preferred embodiments.

FIG. 1 is a schematic diagram of a preferred embodiment npn plasma bipolar junction transistor 10 in a basic external electrical circuit including a time varying voltage source 12 and voltage sources 14 and 16 that establish collector-emitter and emitter-base voltage bias. For the preferred embodiment npn PBJT device of FIG. 1, a low temperature, non-equilibrium plasma 18 replaces the n-type collector of a conventional transistor. Because the electron mobility is much larger than that for ions in a low temperature plasma, the electrical properties of the plasma resemble those for an n-type semiconductor. The plasma can be macroscopic in its dimensions (i.e., characteristic dimension $d \geq 1$ mm) or can be confined by a microcavity (for example, $d < 500$ μm in diameter but preferably less than 100 μm and, in certain preferred embodiments, less than about 10 μm). Microplasmas have, to date, been successfully generated in microcavities as small as $d \approx 10$ μm.

An anode 19 for the plasma collector 18 can be fabricated from any conducting or semiconducting material, including metals, Group IV and Group III-V, semiconductors, organic semiconductors, etc. Other embodiments of the invention employ negative electron affinity (NEA) materials to reduce the cathode fall voltage associated with the collector plasma. The device of FIG. 1, for example, can be fabricated from n-type and p-type diamond. Since the p-type diamond can exhibit NEA and serves as the cathode of the collector plasma (as well as the base of the transistor), the NEA will lower the cathode fall voltage. Consequently, embodiments of the invention can serve to tailor the cathode fall voltage in non-equilibrium plasmas. The result is a reduced operating voltage for the collector plasma.

The anode 19 in the transistor 10 is illustrated as having a general plate shape, but it can also take on a wide variety of shapes, including a plate, pin, cone, ring, mesh, etc. The voltage sources 14 and 16 can provide a DC voltage and/or a time varying waveform, such as a sinusoidal, pulsed, or other type of time-varying voltage waveform. The voltage source 16 can be, of course, be realized as a DC component that is part of an integrated power supply with the voltage source 12 that supplies a time-varying waveform, i.e., the voltage source 12 may include voltage source 16 or also provide the function of voltage source 16. Suitable plasma media that permit generation of the plasma 18 include gas(es), vapor(s), or a combination thereof. In addition to providing the electronic function of a semiconductor to act as the collector of the transistor 10, the macro or microplasma 18 also generates emissions in the infrared, visible, and/or ultraviolet portions of the spectrum. A solid state base 20 and emitter 22 complete the transistor. The base 20 is preferably thinner than the emitter 22, as a thin base tends to minimize recombination losses. The wavelength of the plasma emissions can be tailored using different gas(es) and/or vapor(s). The plasma collector 18 shown in FIG. 1 is integral to the entire device. The plasma collector serves the same purpose as the n-type semiconductor region in the collector of a conventional solid state npn transistor except that the plasma collector is additionally capable of emitting light.

Figure 2:
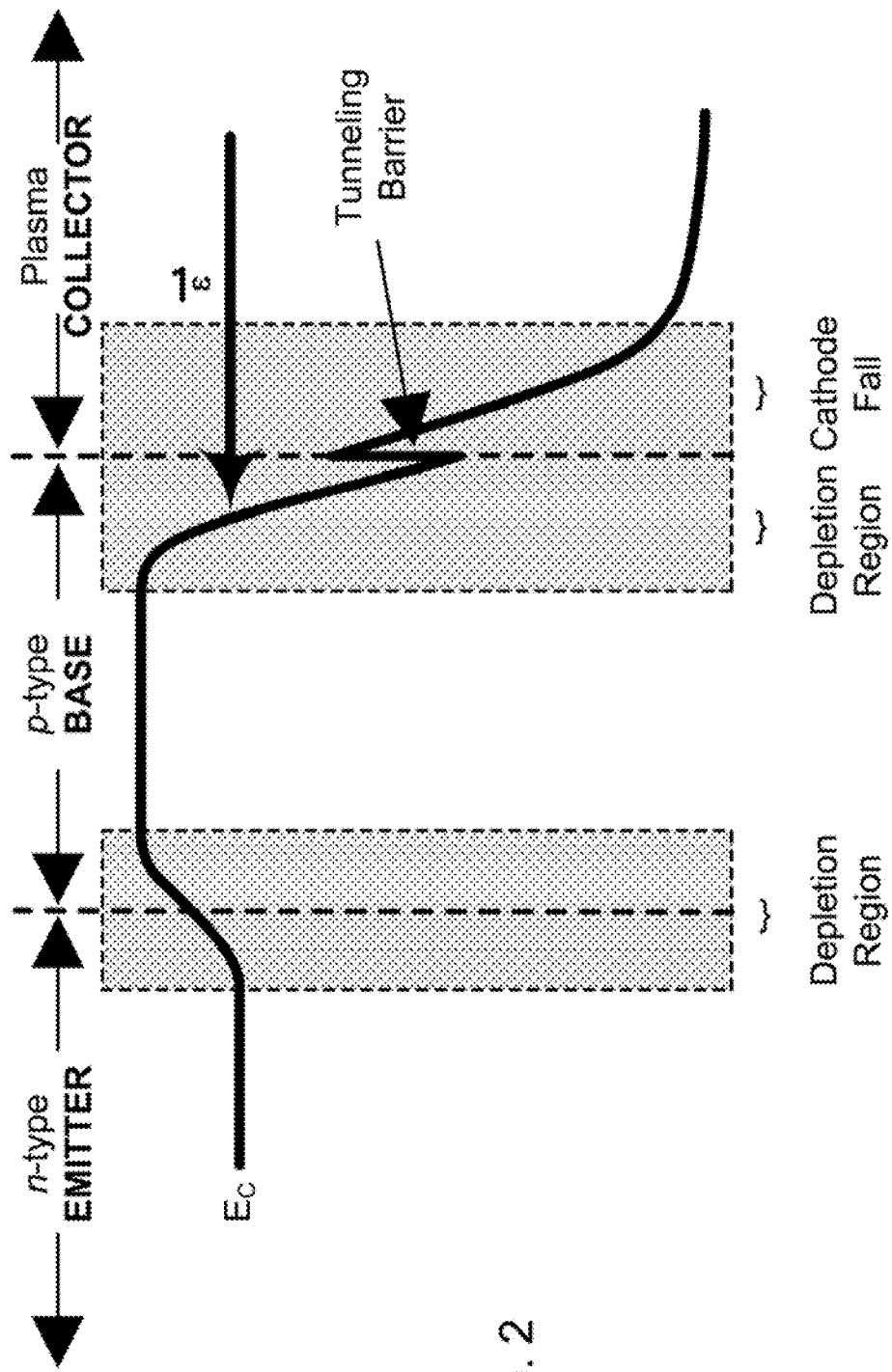
FIG. 2 is a qualitative energy band diagram for the npn hybrid plasma semiconductor transistor device of FIG. 1.

FIG. 2 is a qualitative energy level band diagram for the npn plasma transistor device in FIG. 1. The biasing of the transistor and the way in which it operates is virtually identical to that for a conventional transistor except that the plasma also emits radiation, including light. As with a conventional npn transistor, the emitter-base junction of FIG. 2 is generally forward-biased so to inject electrons into the base.

The base-collector junction is reverse biased. The imposition of a voltage onto the plasma collector anode produces an electric field $\xi$ within the collector as illustrated in the operational diagram of FIG. 1. This field is oriented such that electrons tunneling through (or surmounting) the narrow potential barrier at the base-collector interface will be transported to the anode. Owing to the physical interface between the n-type vapor phase plasma collector 18 and the p-type base 20, a plasma sheath lies at the collector-base junction, and the sheath electric field penetrates a distance into the base 20 that is dependent on the doping level of the base 20. This intense electric field across the collector-base junction assists the tunneling of electrons (having diffused from the emitter-base junction) through the potential barrier at the collector-base junction.

The pn junction in devices of the present invention can be forward-biased, in which case the insertion of the plasma 18 between the base 20 and the anode 19 narrows the potential barrier through which electrons from the base 20 tunnel. This occurs as a result of the plasma sheath that serves as an interface between the solid state semiconductor base 20 and the bulk plasma 18. Most of the potential difference imposed on the plasma 18 appears across the sheath, thereby producing electric field strengths at the surface of the base (i.e., base-collector junction) much greater than those readily produced with an anode in vacuum. In a microplasma operating at atmospheric pressure, for example, the electric field strength in the plasma sheath is on the order of hundreds of kV/cm. The strong electric field in the present invention steepens the slope of the tunneling barrier (FIG. 2) that faces the plasma 18, thereby making the barrier narrower. Aside from emitting light, yet another advantage of the plasma BJT 10 of FIG. 1 is that electrons entering the plasma from the transistor base 20 are multiplied in the plasma by avalanche. No analogous mechanism exists in a vacuum. In summary, the intense electric field in the sheath of the plasma collector 18 facilitates electron tunneling through the potential barrier shown in FIG. 2. The avalanche process multiplies the electrons emerging from the base 20, resulting in an enhancement in the emission of light from the plasma 18. It is noted that the ions in the sheath are accelerated toward the base 20, where electrons are produced by secondary emission. This also contributes to the current in the collector 18.

Figure 3:
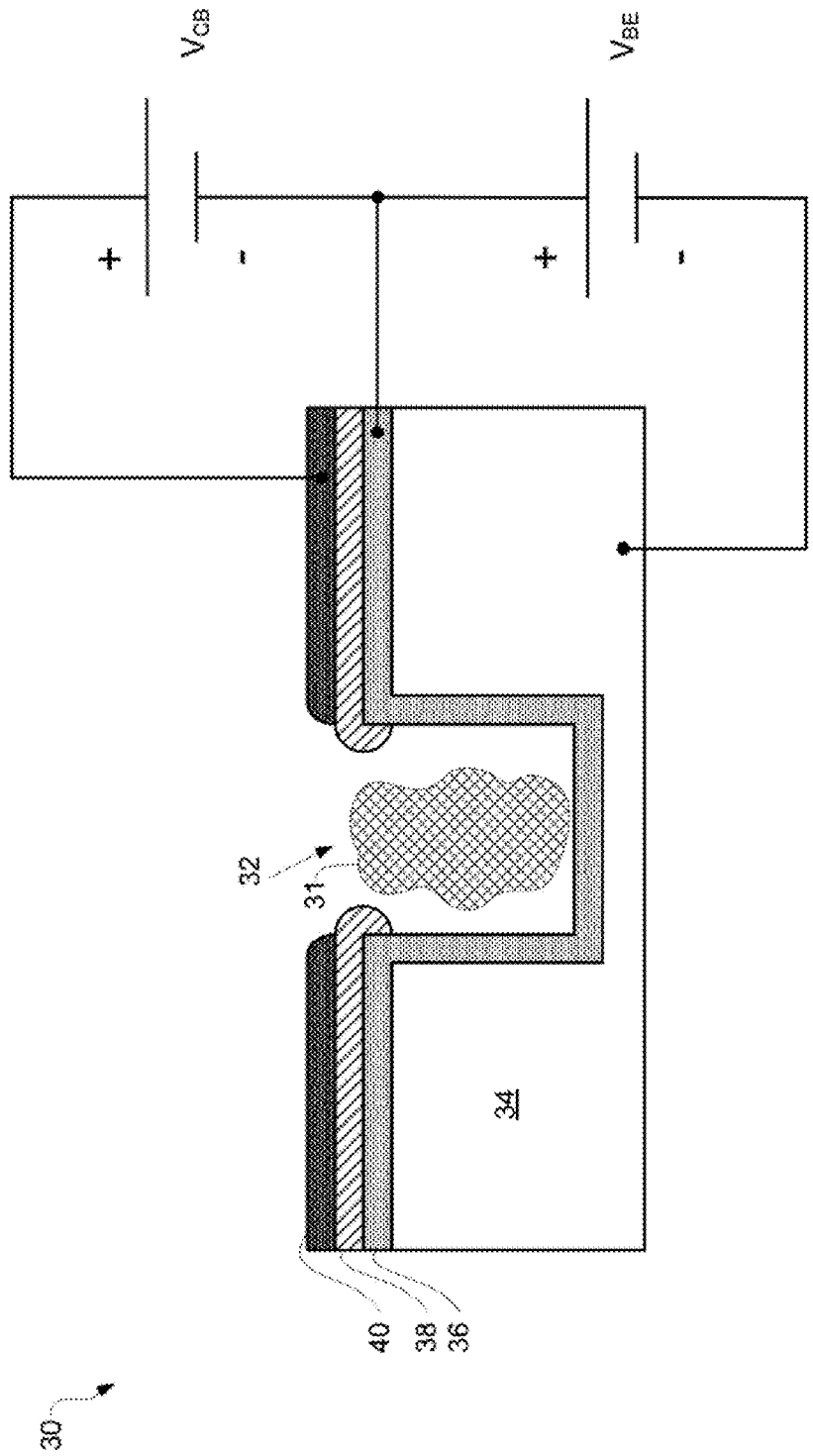
FIG. 3 is a schematic cross-sectional diagram of a preferred embodiment npn hybrid microplasma semiconductor bipolar junction transistor that operates in accordance with FIGS. 1 and 2.

FIG. 3 is a schematic cross-sectional diagram of a preferred embodiment npn plasma-semiconductor transistor 30 that operates in accordance with FIGS. 1 and 2. Microplasma 31 is formed in a microcavity 32 that penetrates an n-type substrate 34. The microplasma 31 acts as the collector of the transistor. The cross-section of the microcavity 32 can take on any of a wide variety of geometric shapes (circular, square, diamond, etc.), need not be uniform with depth, and generally has transverse dimensions in the range of 10 μm-1 mm. In preferred embodiments, the microcavity 32 has transverse dimensions of about 100 μm or less to transversally confine microplasma. The microcavity 32 is formed in an n-type silicon substrate 34 that forms the emitter and a thin p-type base layer 36 is formed on the microcavity walls, such as by a conventional diffusion process. A dielectric layer 38 deposited around the perimeter of the microcavity electrically isolates a thin-conducting anode layer 40. The microplasma 31 formed in the microcavity 32 can be modulated by only the few volts required to drive the emitter-base junction. The voltages $V_{BC}$ and $V_{EB}$ can also be time-varying.

The dielectric 38 in preferred embodiments, such as FIG. 3, is silicon dioxide and the substrate 34 is device quality silicon. Other exemplary suitable materials for the dielectric 38 include silicon nitride, aluminum oxide, yttrium oxide, or CVD grown dielectrics (such as diamond) and multilayer dielectric stacks. Also, other device quality materials, such as Group III-V semiconductors can be used in place of silicon for the substrate. The specific choice of dielectric is dependent upon several factors, including the material of the substrate, the dielectric breakdown strength, and the film quality (porosity, uniformity, etc.) that can be achieved with inexpensive deposition processes.

Figure 4:
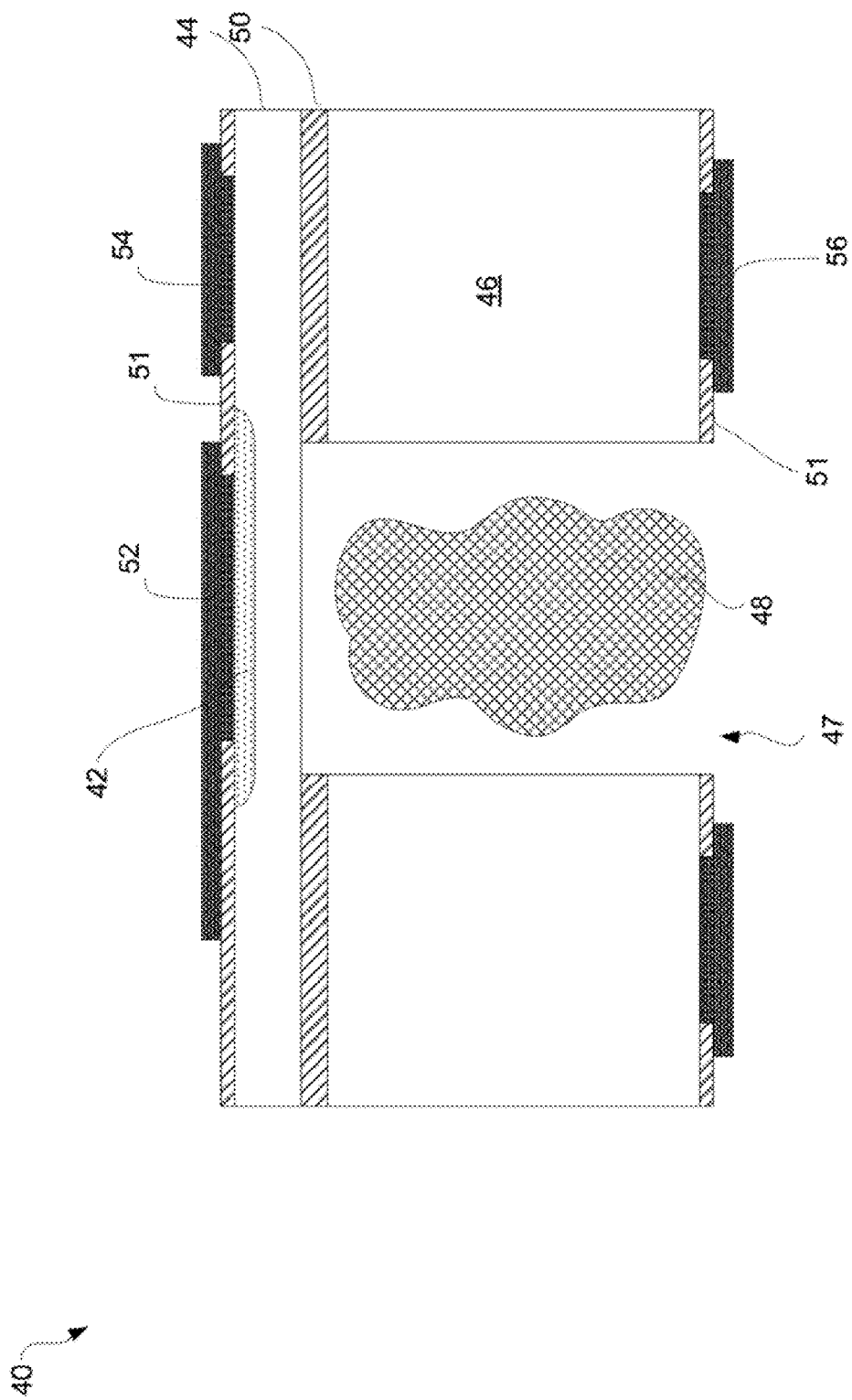
FIG. 4 is a schematic cross-sectional view of another preferred embodiment npn hybrid microplasma semiconductor bipolar junction transistor.

FIG. 4 is a schematic cross-sectional view of another preferred embodiment npn plasma bipolar junction transistor 40. The diagram of FIG. 4 is that of a detailed preferred embodiment of the device operationally illustrated in FIG. 1. An n-type emitter 42 is produced in a p-type wafer 44 that serves as the base of the transistor. Another silicon layer 46 defines a microcavity 47 and serves as a cylindrical anode for a plasma collector 48. The anode 46 can be doped either n-type or p-type, and the collector plasma 48 is produced between the p-type base and the cylindrical collector anode 46. The level of doping of the collector anode 46 will determine the magnitude of the resistance (ballast) in series with the collector plasma but it does not otherwise impact the operation of the transistor. A buried dielectric film 50, e.g. $SiO_2$, isolates the base 44 from the anode 46. Additional thin dielectric 51 formed on the base 44 isolates metal emitter and base contacts 52 and 54 from each other. An anode metal contact 56 and the thin dielectric 51 on the bottom of the device complete the device.

Figure 5A:
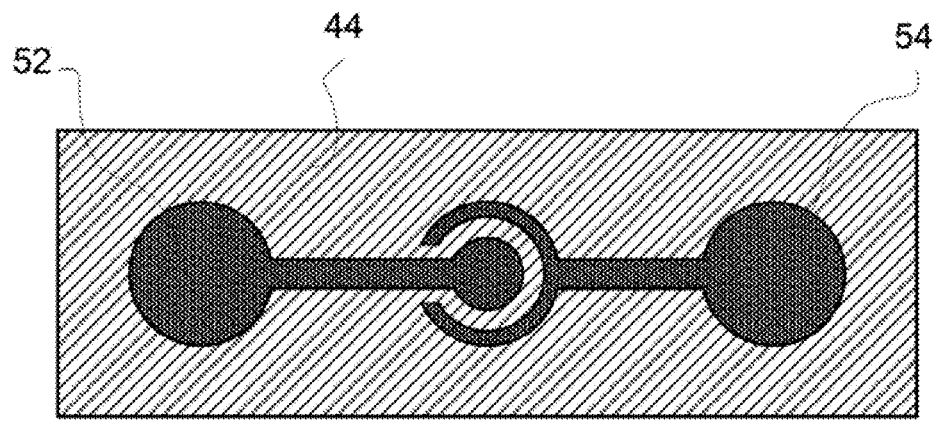
FIGS. 5A and 5B are top and bottom schematic views, respectively, of the transistor of FIG. 4.
Figure 5B:
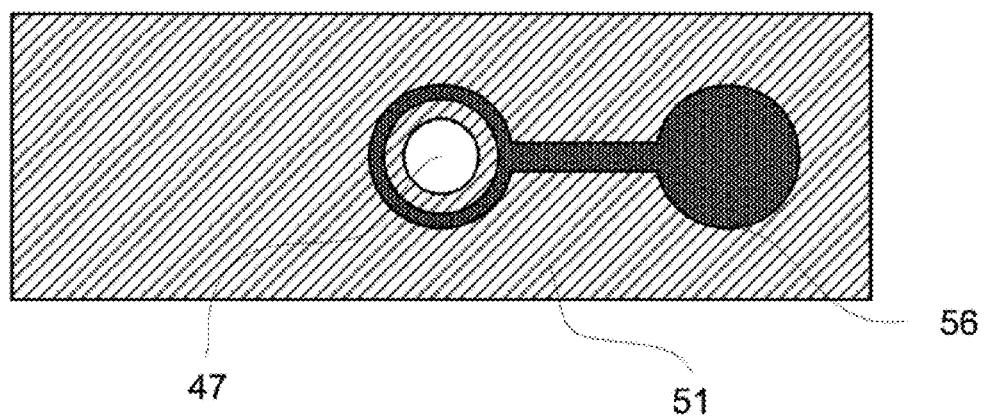

FIGS. 5A and 5B are top and bottom views, respectively, of the transistor 40 of FIG. 4. As seen in FIG. 5A, the base and emitter contacts can be patterned and isolated from each other in a fashion that is readily extendable to form more complex circuits, including multiple devices and interconnection patterns. As seen in FIG. 5B, the anode contact 56 is patterned so as to encompass the periphery of the microcavity 47.

The device 40 can be fabricated from silicon-on-insulator (SOI) wafers or on a p-type wafer. In the case of fabrication from SOI substrates, the SOI wafer includes two silicon wafers that sandwich a layer of silicon dioxide. The oxide is grown on one wafer and then is bonded to the other silicon wafer. Typically, the thicker of the two is referred to as the handle wafer or layer. This is usually several hundreds of microns thick. The typical range of the thickness of the sandwiched oxide is nominally 0.5 µm-5 µm. The other silicon layer of the SOI structure is commonly referred to as the device wafer or layer. The thickness of this layer can vary from as little as 1 µm to the same thickness as that of the handle wafer.

Figure 6:
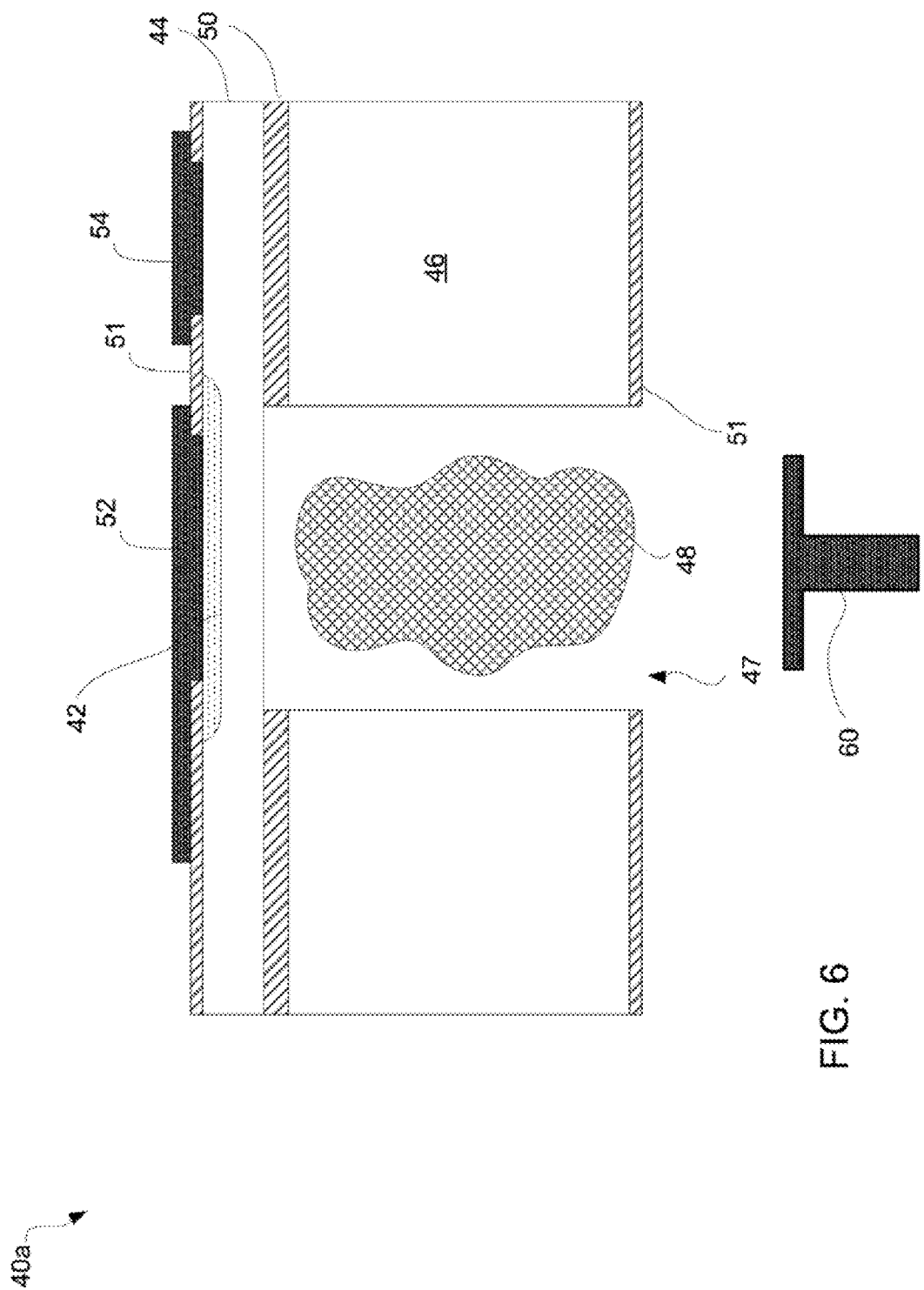
FIG. 6 is a schematic cross-sectional view of another preferred embodiment npn hybrid microplasma semiconductor bipolar junction transistor incorporating an external electrode.

FIG. 6 is a schematic diagram in cross-section of another preferred embodiment npn plasma bipolar junction transistor 40a that is based on fabrication using an SOI substrate. This embodiment is similar to that of FIGS. 4, 5A and 5B except that a collector anode 60 is external to the remainder of the transistor 40a. Operationally, the device is the same as the FIGS. 4, 5A and 5B device, and common reference numbers are used in FIG. 6. As previously mentioned, shown as being flat, the collector anode 60 in FIG. 6 can assume any of a variety of shapes (ring, cone, etc.). Unlike in FIG. 4, the silicon layer 46 does not serve as the collector anode but does provides a cylindrical (or other shape) wall that is at least partially conducting.

Figure 7:
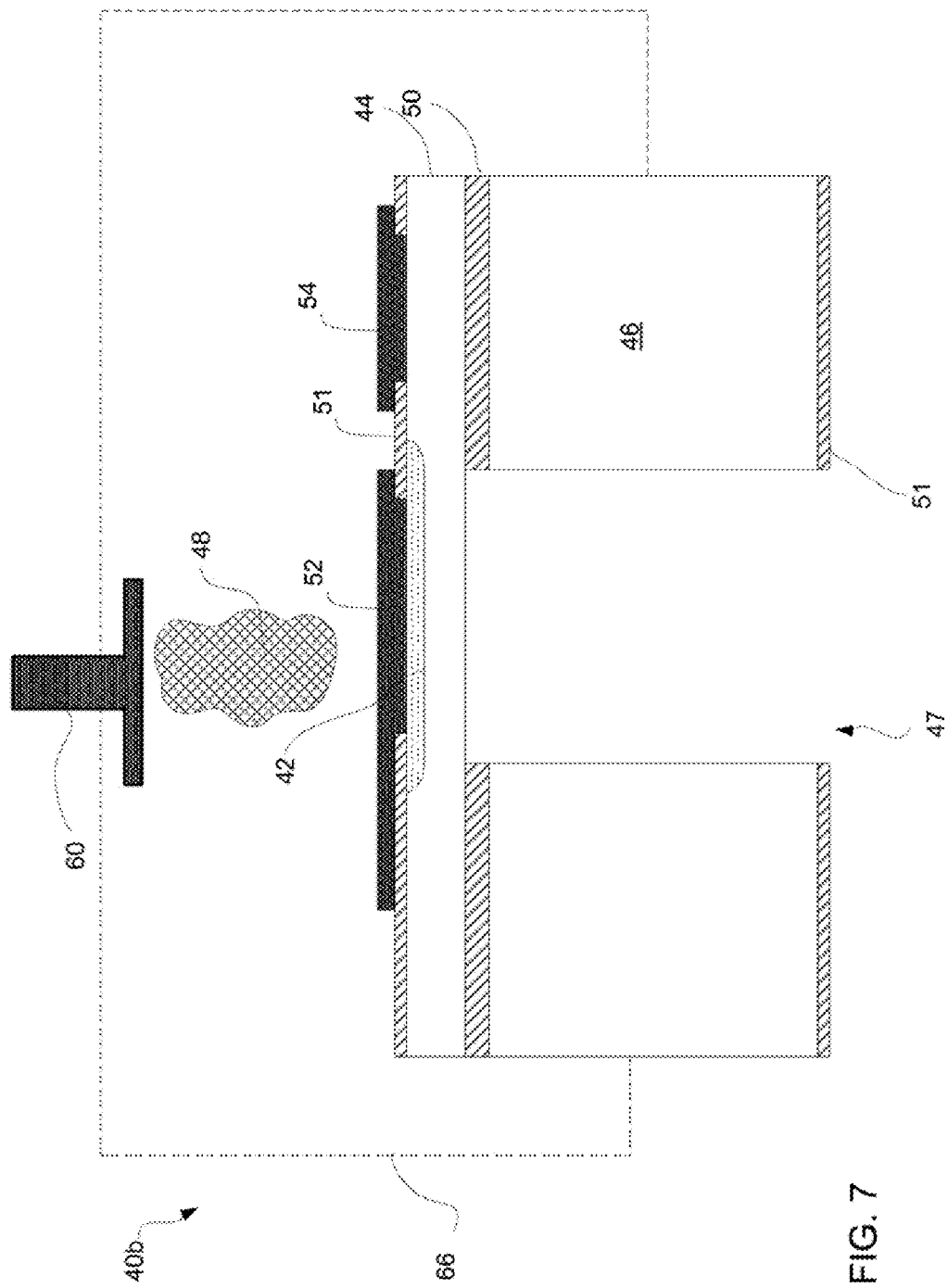
FIG. 7 is a schematic cross-sectional view of a preferred embodiment npn hybrid plasma semiconductor bipolar junction transistor incorporating an external electrode.

A cross-sectional diagram of another preferred embodiment npn hybrid plasma transistor 40b is shown in FIG. 7. The difference in this embodiment from the FIG. 6 embodiment is the position of the external collector anode 60, and accordingly emitter 42, with changes in the position of the contacts. This embodiment illustrates the principle that the plasma collector 48 can be a macroplasma instead of a microplasma. In the embodiment of FIG. 7, the macroplasma 48 is not confined laterally and can occupy a substantial volume (tens of $cm^3$ to liters). There is no upper or lower size limit to the device, in general. The limiting factor to device operation is when the electric field at the cathode (upper surface of base layer 44) is sufficiently intense to cause either avalanche breakdown of the collector-base junction and/or punch through. Punch-through occurs when the electric field at the cathode is sufficiently strong to cause the collector-base depletion region to extend to the emitter-base junction. In the FIG. 7 embodiment, the layer 46 does not have to be conducting, and materials such as glass and ceramics can be used. Alternatively, the layer 46 can be completely omitted.

Figure 8:
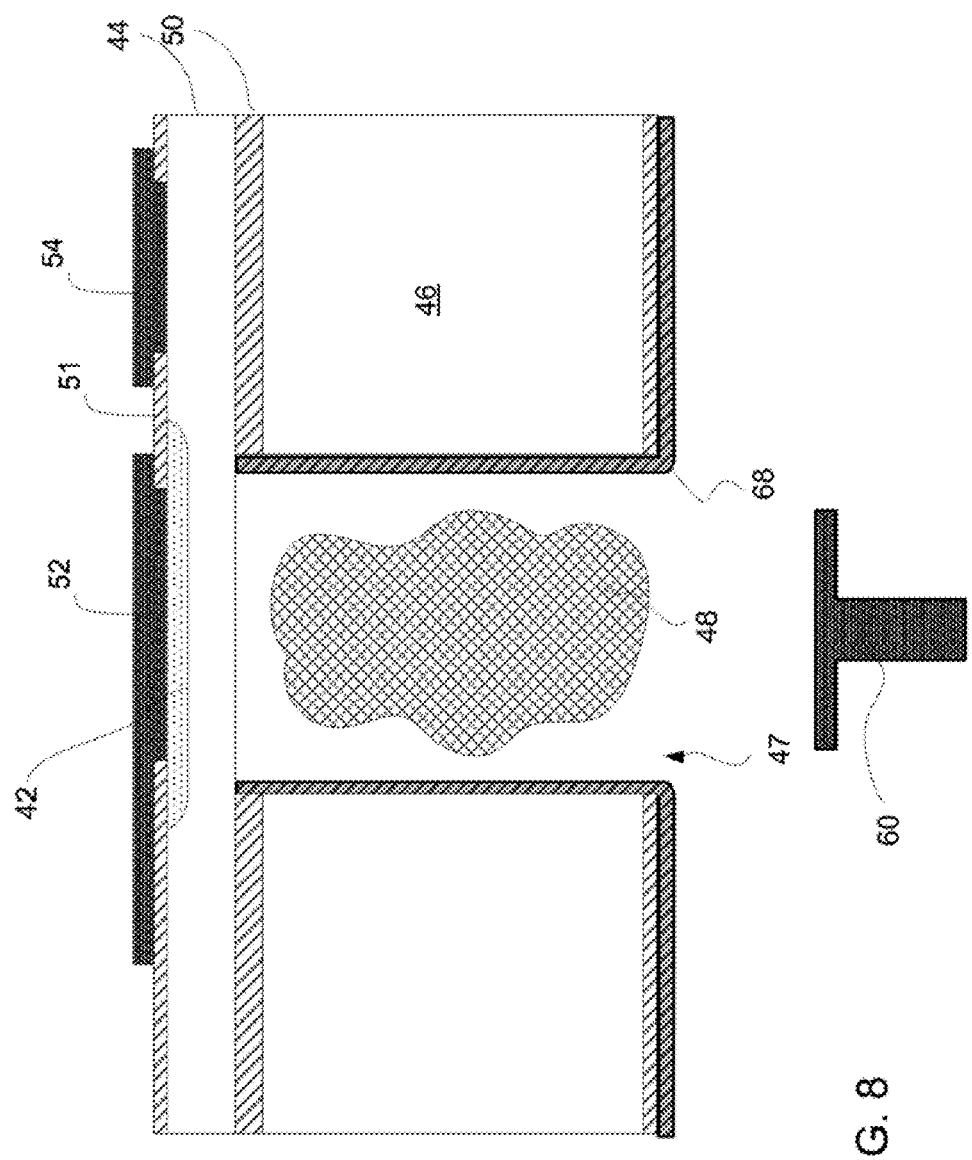
FIG. 8 is a schematic cross-sectional view of another preferred embodiment npn hybrid micro plasma semiconductor bipolar junction transistor incorporating an external electrode.

The voltages and gas pressures required for the embodiment of the FIG. 7 are dependent upon three factors: the shape (geometry) of the anode, the gap between the anode and the p-type silicon base, the identity of the gas, and its pressure. As an example, an anode-base gap of 1 mm will require a neon or argon pressure in the range of nominally 10-100 Torr. Larger gaps require lower gas pressure and vice-versa. With a sufficiently small anode-base (cathode) gap, typically less than about 400 µm, operation at atmospheric pressure is possible. In the illustrated embodiment, an enclosure 66 encloses a plasma medium within the anode-base gap. FIG. 8 shows another embodiment transistor 40c that is a modified version of the FIG. 6 embodiment, and includes an extra dielectric layer 68 that isolates the walls of the microcavity 47 from the plasma to protect the walls from the plasma. In the FIG. 6 embodiment, charge can build up on the microcavity walls, which impacts the voltage-current characteristics of the device.

Figure 9A:
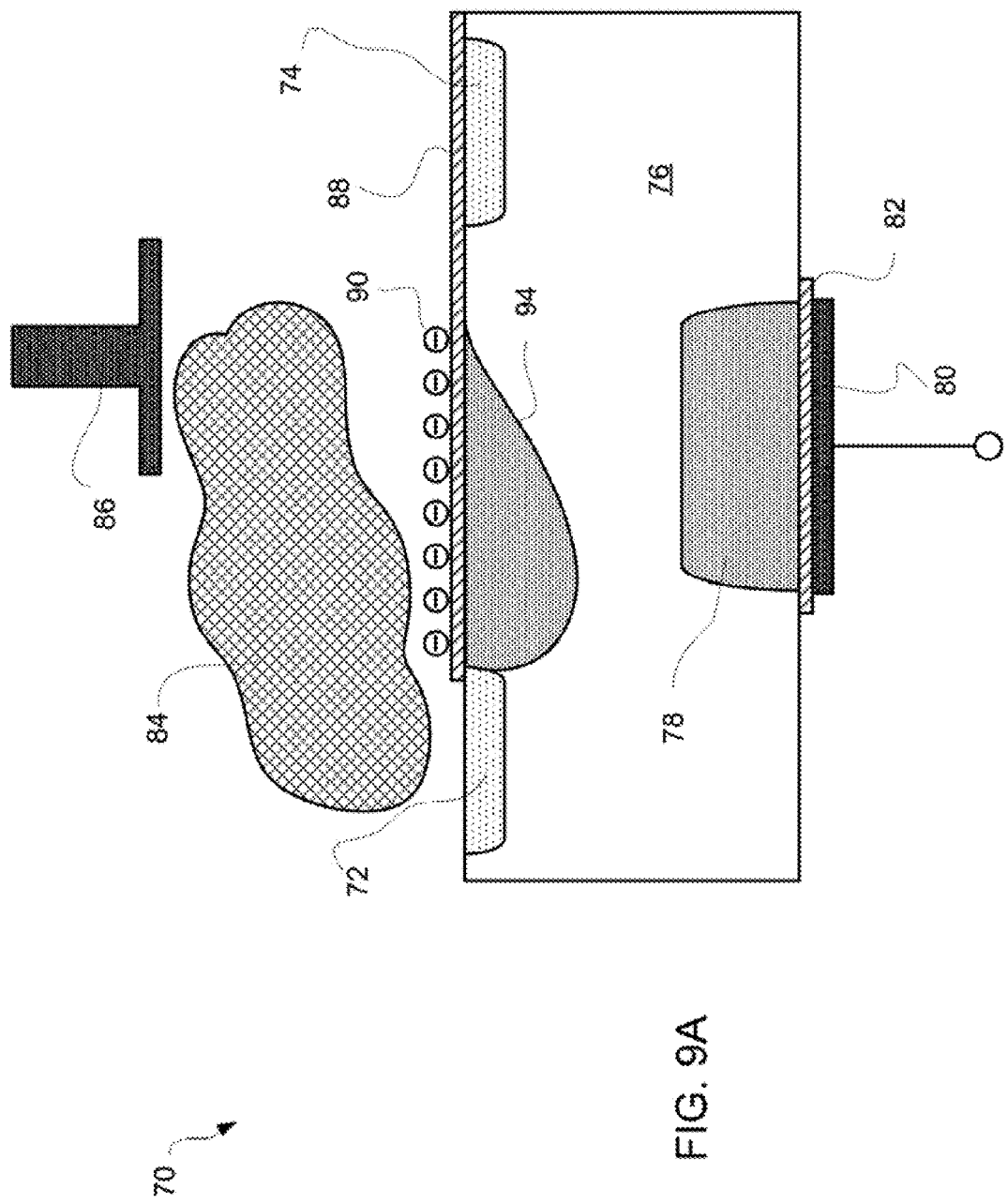
FIGS. 9A, 9B, and 9C are schematic cross sectional views of preferred embodiment MOSFET devices in which a plasma serves as the gate.
Figure 9B:
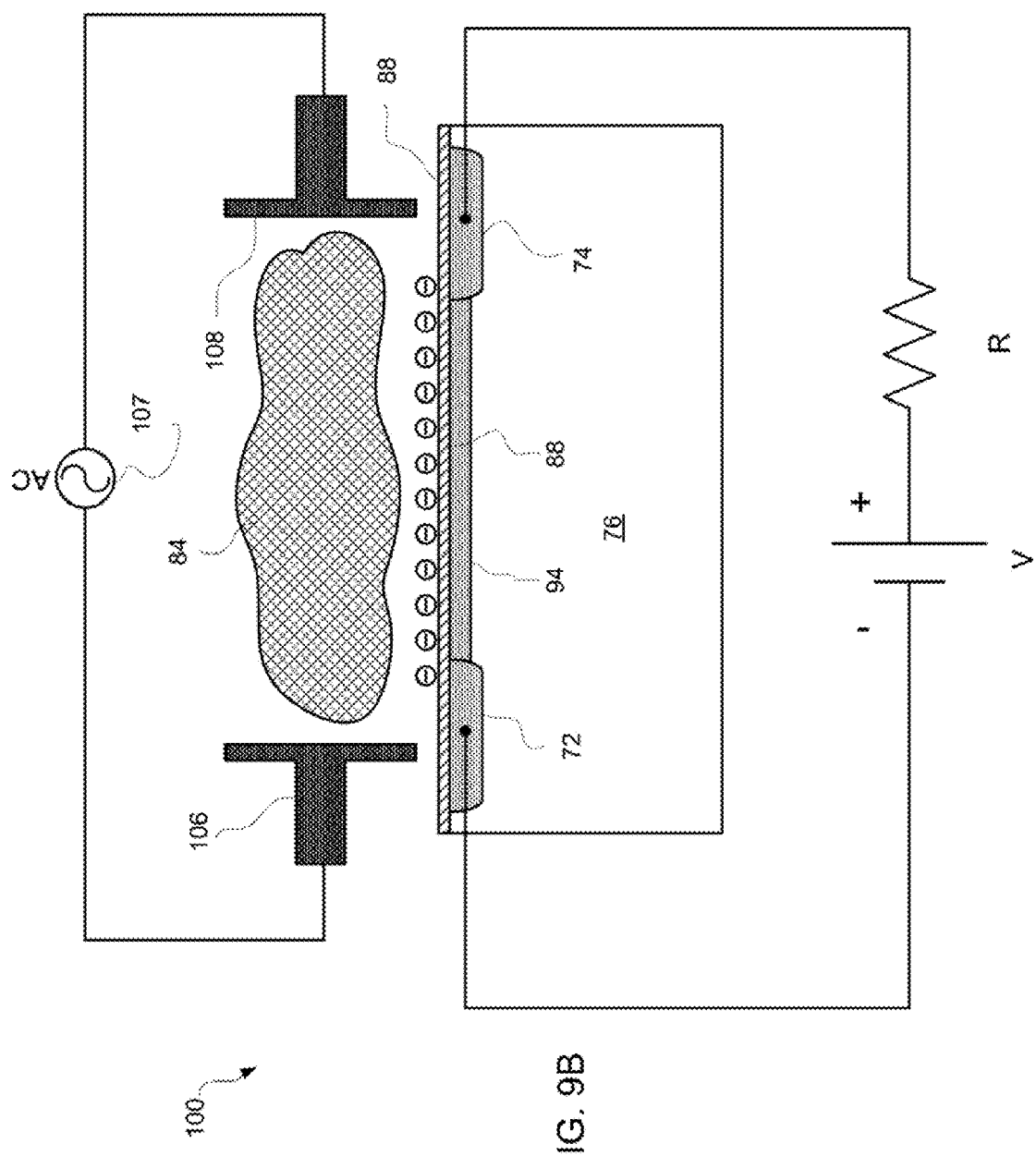
Figure 9C:
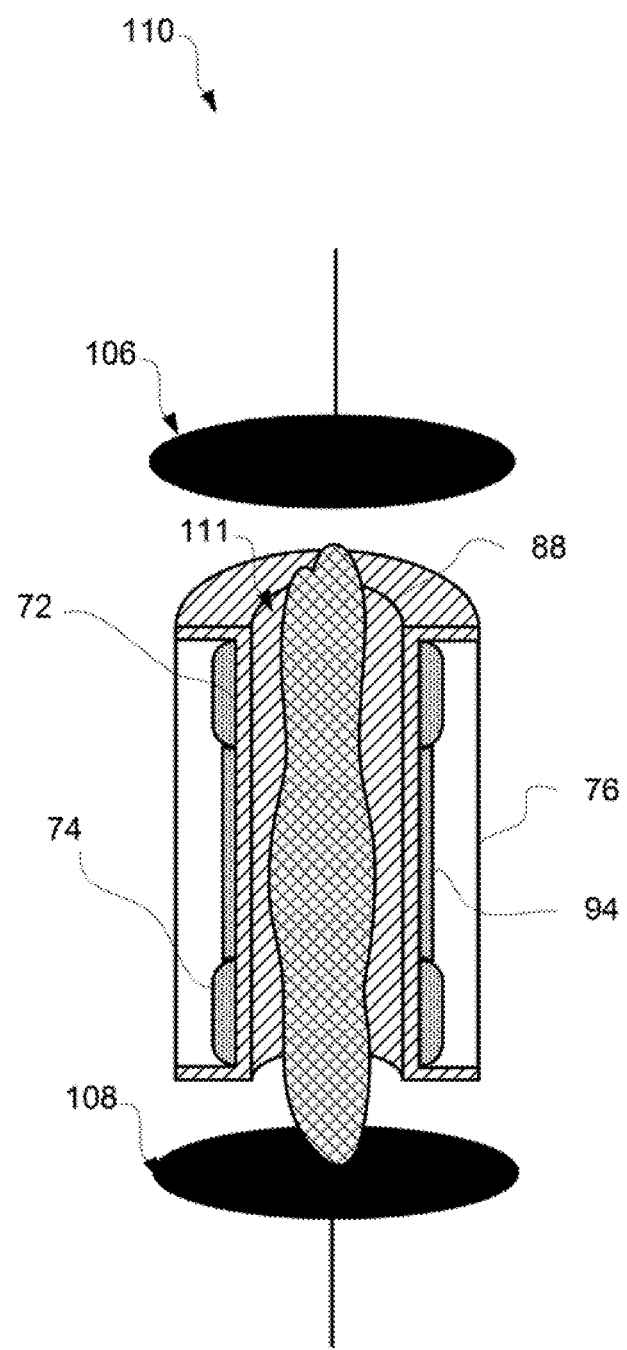

Metal-oxide field effect transistor (MOSFET) transistors can also be formed in accordance with the invention, and three preferred embodiment MOSFET transistors of the invention are shown in FIGS. 9A, 9B, and 9C, respectively. Each of these embodiments is a hybrid plasma-semiconductor device in which a generated plasma or microplasma serves to control a conducting channel of the transistor. In FIG. 9A, a MOSFET transistor 70 includes separate $n^+$ source 72 and drain 74 regions, which can be fabricated by diffusion are into the surface of an n-type substrate 76 immediately below the surface of the substrate 76. A p-type region 78 is between the source 72 and drain regions but in an opposite side of the substrate 76. The p-type 78 region is isolated from a second gate electrode 80 by a gate dielectric film 82. The gate function is achieved by a plasma 84 generated by a voltage potential applied by an anode 86, and the plasma influences channel formation. The plasma is generated in the region between the $n^+$ source 72 and the anode 86 and is isolated from portions of the substrate 76 that include the drain region 74 and a channel region between the source 72 and the drain by a dielectric film 88. During operation, the plasma 84 charges the exterior surface of the dielectric film 88 negative because of electrons 90 deposited on the surface of the dielectric film 88. This charge accumulation on the dielectric film 88 as a result of the plasma 84 serves the same purpose as a conventional gate in a solid state MOSFET since the negative charge build up will induce a depletion region 94 underneath the dielectric film 88 between the source 72 and drain 74. If the plasma electron density is sufficiently high, charge on the dielectric film will cause the depletion region 94 to change to an inversion (p-type) region that will eventually pinch-off the MOSFET. Consequently, the plasma 84 serves to regulate the flow of current of the MOSFET. Application of voltage potential to the gate electrode 80 serves to tune the width of the conduction channel. The plasma 84 can be modulated by the modulation of power provided to the anode 86, thereby modulating the charge deposited on the dielectric film 88 and varying the width of the depletion region and the conductivity of the conducting channel under the top oxide layer. That is, the plasma serves as a gate to control a conduction channel induced between the n-type source and drain regions. The MOSFET in FIG. 9A is operating in depletion mode. One skilled in the art would appreciate that the device is capable of operation in either depletion or enhancement mode.

FIG. 9B shows another MOSFET transistor 100 of the invention, and common reference numerals from FIG. 9A are used to label similar parts. With the transistor of FIG. 9B, the plasma or microplasma 84 deposits electrons on the dielectric film 88, underneath which are two separated p-type source and drain regions 72 and 74 formed within (and at the surface of) the n-type substrate 76. The appearance of negative charge from the plasma gate on the dielectric film repels conduction band electrons in the channel region under the dielectric film between the source and drain regions 72 and 74, leading to the formation of an inversion region extending between the two p-type source and drain regions. The plasma or microplasma is sustained by electrodes 106 and 108 external to the semiconductor. The plasma 84 of FIG. 9B can be modulated by the power source 107, thereby modulating the charge deposited on the oxide and varying the width of the depletion region and the conductivity of the conducting channel under the top oxide layer.

FIG. 9C shows a cut-away view of another embodiment MOSFET transistor 110 that behaves in a manner analogous to the FIG. 9B transistor 100. The transistor 110 has a cylindrical geometry in which the plasma 84 is centered on the axis of the device that creates a microcavity 111.

If the electrodes 106 and 108 above and below the cylindrical plasma channel device are fabricated in the form of rings, then the embodiment of FIG. 9C can also serve as an optical amplifier or laser. Forming laser gain could be achieved with installation and alignment of mirrors on either end of the device (outside the electrodes 106 and 108). Gases and gas-mixtures suitable for laser action are well known in the art. The devices of FIGS. 9A-9C can be photosensitive, because the plasma 84 is capable of absorbing incoming microwave and optical radiation.

Figure 10:
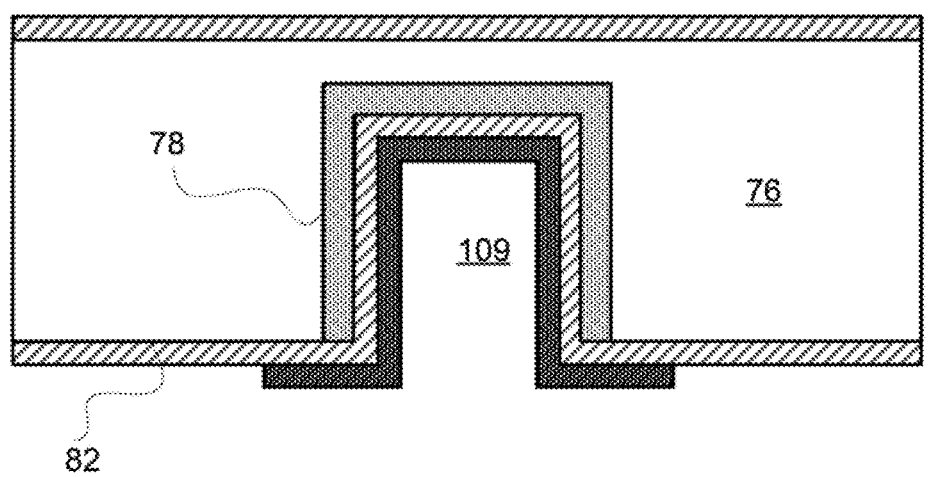
FIG. 10 is a schematic cross-sectional view of a preferred embodiment p-type diffused region (and associated gate electrode) suitable for incorporation into the device structure of FIG. 9A.

The devices in FIGS. 9A and 9B can be modified by backside processing to add a cavity and diffuse a p-type region 78 near the channel. FIG. 10 is a cross-sectional diagram showing in detail one embodiment of the diffused p-type region 78 for the secondary gate of FIG. 9A in the n-type semiconductor 76. Processing of an n-type semiconductor wafer begins by etching the wafer from the backside to create a microcavity 109 in the spatial region in which the location of a secondary gate is desired. After forming the p-type region 78 by diffusing an appropriate dopant into the wall of the etched cavity 109, then dielectric film 82 is deposited or grown on both sides of the wafer. Finally, the metal layer 80 (secondary gate electrode) is deposited within the cavity 109. The cavity 109 on the wafer backside brings the p-type region 78 in closer proximity to the top surface of the wafer where the plasma 84 induces the conduction channel.

Figure 11A:
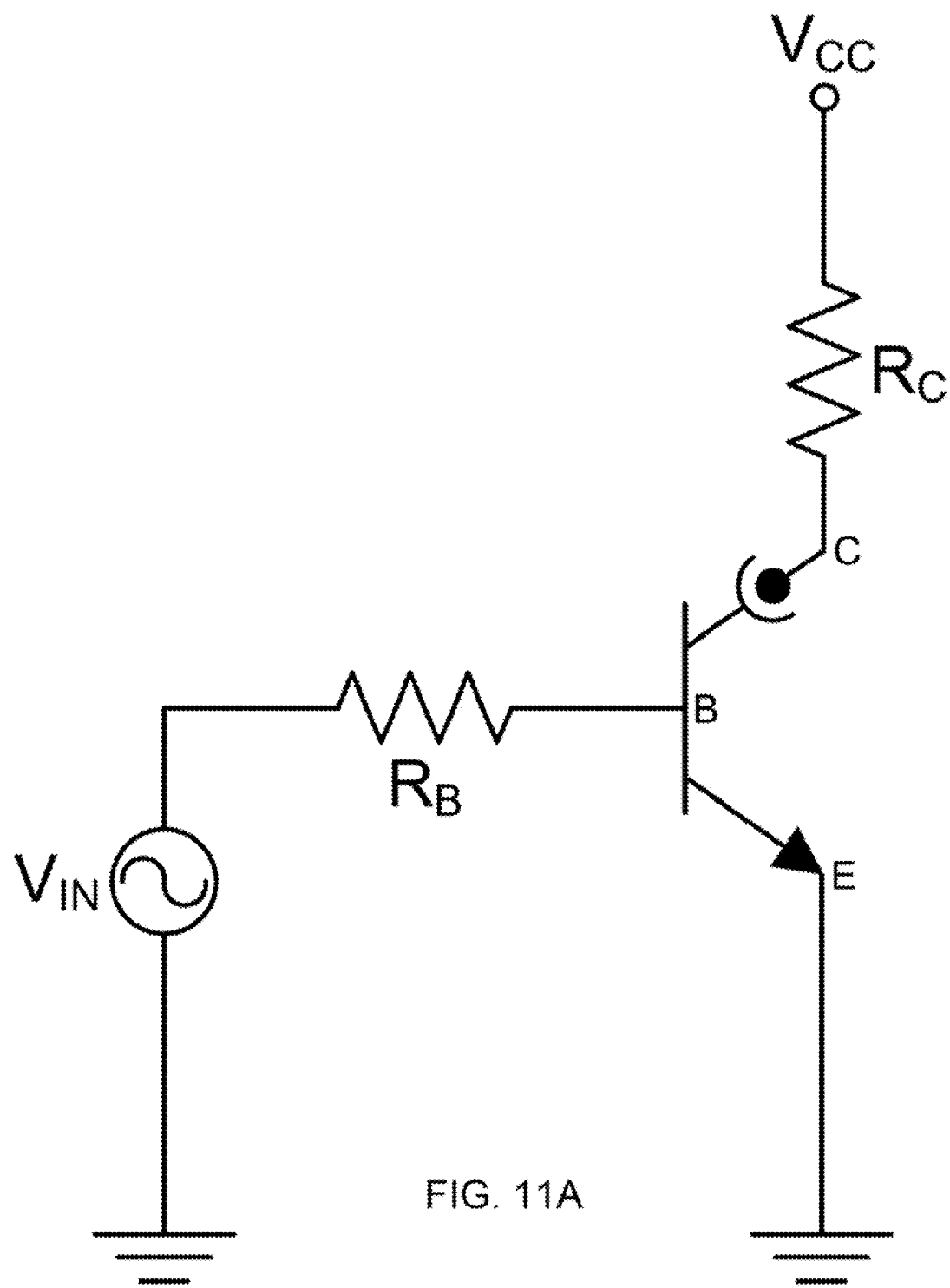
FIG. 11A is a schematic diagram of an electrical circuit used to test an experimental npn hybrid plasma semiconductor bipolar junction plasma transistor of the invention.
Figure 11B:
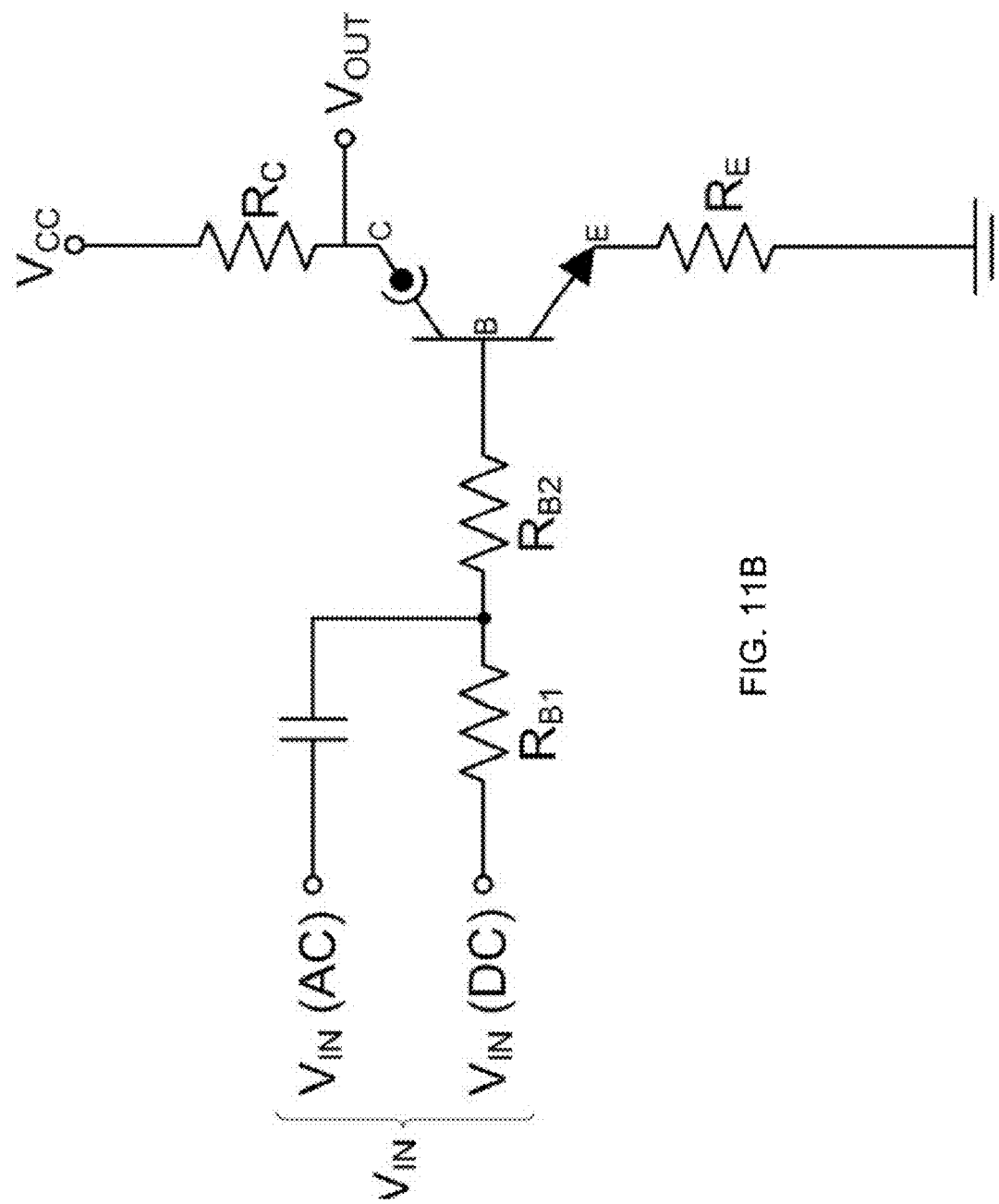
FIG. 11B is a schematic diagram of an amplifier circuit including an npn hybrid plasma semiconductor bipolar junction plasma transistor of the invention.

Plasma bipolar junction transistors of the embodiment of FIG. 8 have been fabricated at the University of Illinois and tested successfully. Preliminary data were obtained by with the simple circuit of FIG. 11A. In FIG. 11A, the symbol adopted for the npn hybrid plasma transistor is almost identical to that for a conventional npn bipolar transistor except for the solid dot and semicircle inserted into the collector lead. In the last century, the presence of a solid dot within the symbol for an electron tube indicated that the tube was gas-tilled, thus generating a gas phase plasma suitable for voltage regulation, modulation, or switching. FIG. 11B illustrates an amplifier circuit that is based upon the hybrid BJT transistor. This simple circuit allows for both DC and AC signals to be applied to the base.

Figure 12A:
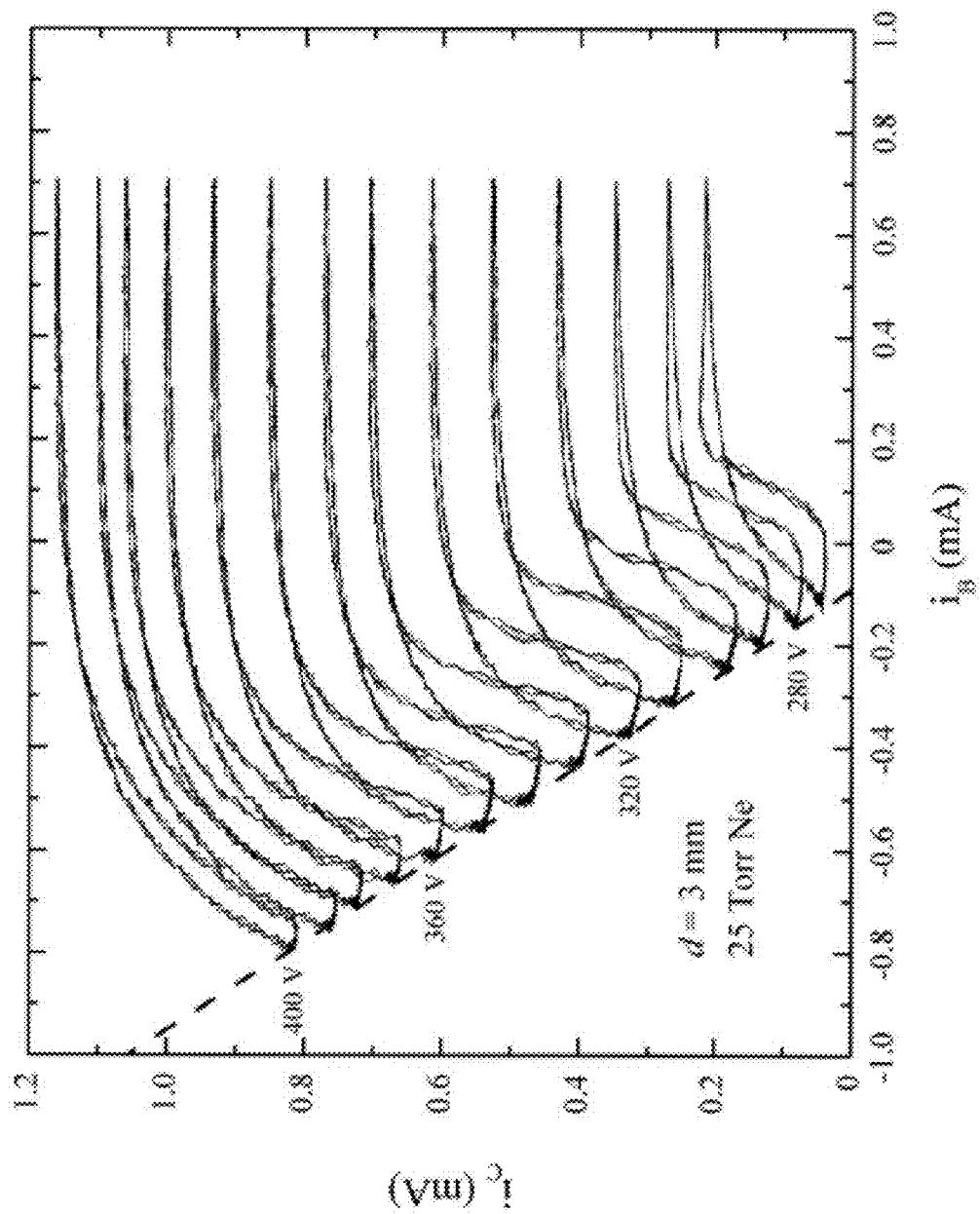
FIG. 12A shows experimental data obtained for an experimental hybrid plasma semiconductor transistor of the invention, comprising a family of collector current ($i_C$) versus base current ($i_B$) characteristics for which $V_{CC}$ is varied in 10 V increments from 270 V to 400 V and the Ne pressure in the collector is 25 Torr.
Figure 12B:
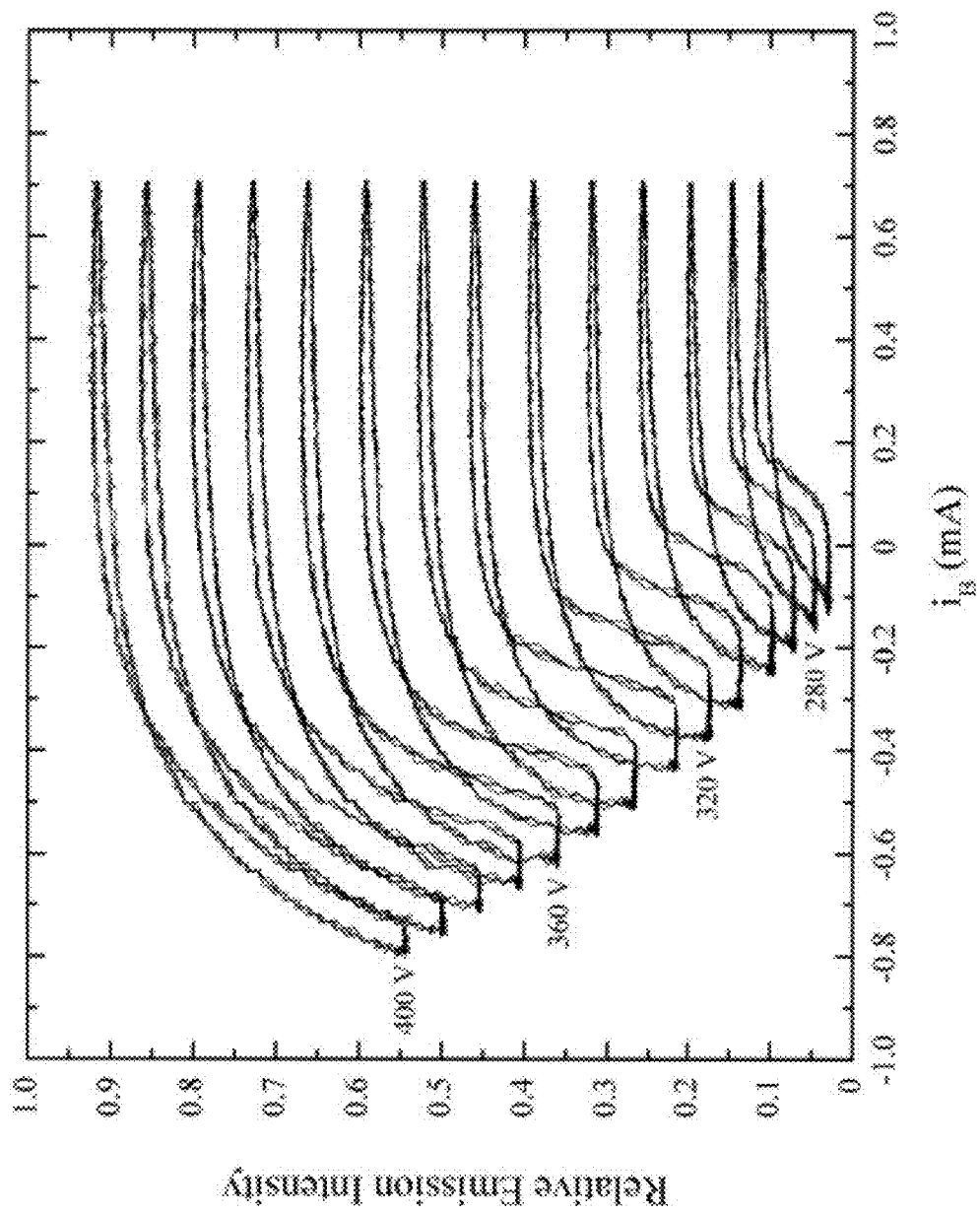
FIG. 12B shows experimental data obtained for hybrid plasma semiconductor transistor of the invention, comprising a family of light emission intensity versus base current ($i_B$) characteristics for which $V_{CC}$ is varied in 10 V increments from 270 V to 400 V and the Ne pressure in the collector is 25 Torr.
Figure 13:
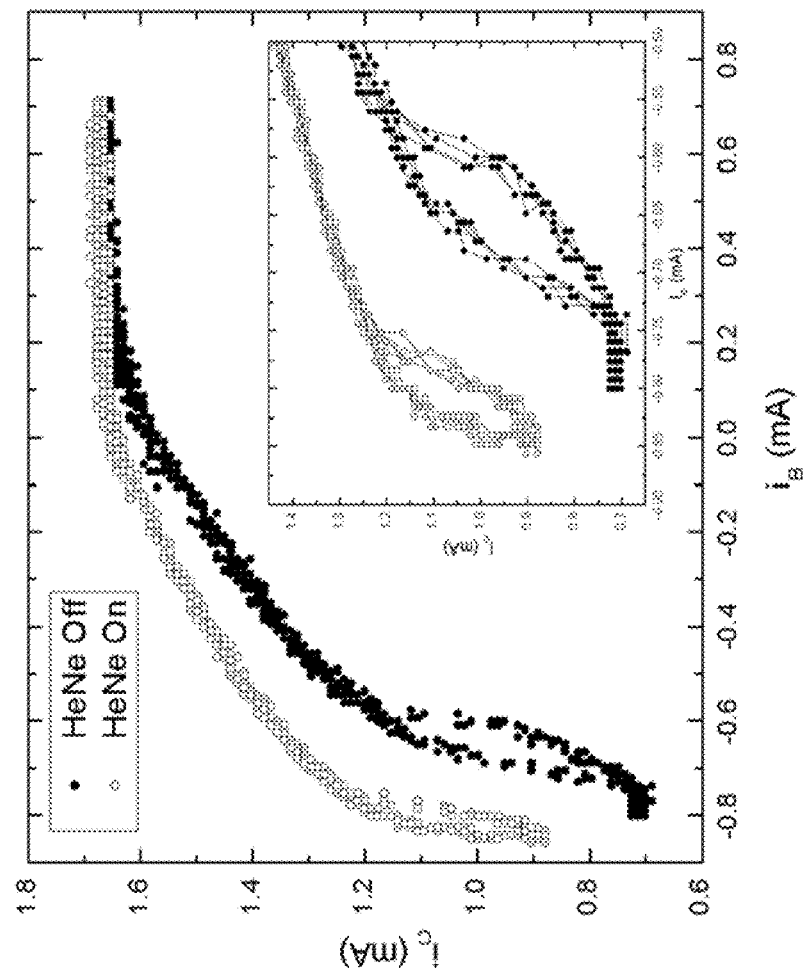
FIG. 13 shows data for an experimental hybrid plasma semiconductor transistor of the invention, illustrating the change in $i_C$-$i_B$ characteristics when the emitter-base junction of an npn plasma/semiconductor bipolar junction transistor is illuminated by He—Ne laser radiation.

FIGS. 12A and 12B show sets of 14 electrical characteristics for an npn PBJT in which the collector plasma of the FIG. 8 embodiment was produced in a 3 mm diameter microcavity, with a base thickness of ~15 μm and a base resistivity of 1-10 Ω-cm. This device utilized an anode, in the form of a flat platinum electrode, placed ~2 mm from the cathode (external surface of the p-type base). The gas in the collector was Ne at a pressure of 25 Torr and the PBJT was fabricated in silicon. Also, $R_C$=67.2 kΩ and $R_B$=5 kΩ. The ordinate and abscissa of FIG. 12A show the collector current ($i_C$) and base current ($i_B$), respectively, both of which are displayed in terms of their instantaneous values. In FIG. 12B, the ordinate is relative emission intensity. The base signal voltage ($V_{IN}$ of FIG. 11A) is an 8 V (peak-to-peak), 200 Hz sinusoid. The curves of FIG. 12 correlate with $V_{CC}$ varied from 270 V to 400 V (DC) in increments of 10 V. Several unique properties of the present hybrid transistor are apparent. One of these is that $i_C$ is not zero for some negative values of the base current because the hybrid plasma transistor can be operated as a phototransistor. A fraction of the light emitted by the collector plasma is absorbed at the exposed base, thus producing electron-hole ($e^-$-$h^+$) pairs that generate a base current (positive feedback). This behavior is demonstrated clearly in FIG. 13 for two $i_C$-$i_B$ characteristics recorded under identical conditions except that, for the upper of the two data sets, radiation from a He—Ne laser (632.8 nm) was directed onto the base of the transistor while the device was operating and a plasma was present. For a given value of collector current, the magnitude of the base current increases by as much as 25-30% when the base is irradiated by the laser. The inset of FIG. 13 shows the −0.85 mA≦$i_B$≦−0.50 mA region in more detail. Another aspect of the $i_C$-$i_B$ characteristics of FIGS. 12 and 13 is the hysteresis that is particularly noticeable for smaller values of the base current ($i_B$≦0.2 mA). This effect appears to be due to the large base-emitter capacitance of experimental devices and, thus, charge stored in the base. Commercial fabrication techniques can minimize or eliminate this behavior. FIG. 12B shows the variation with base current of the visible light intensity produced by the collector plasma. The experimental parameters are the same as those of FIG. 12A. FIGS. 12A and 12B demonstrate the correlation between collector plasma current and light emission intensity.

Figure 14:
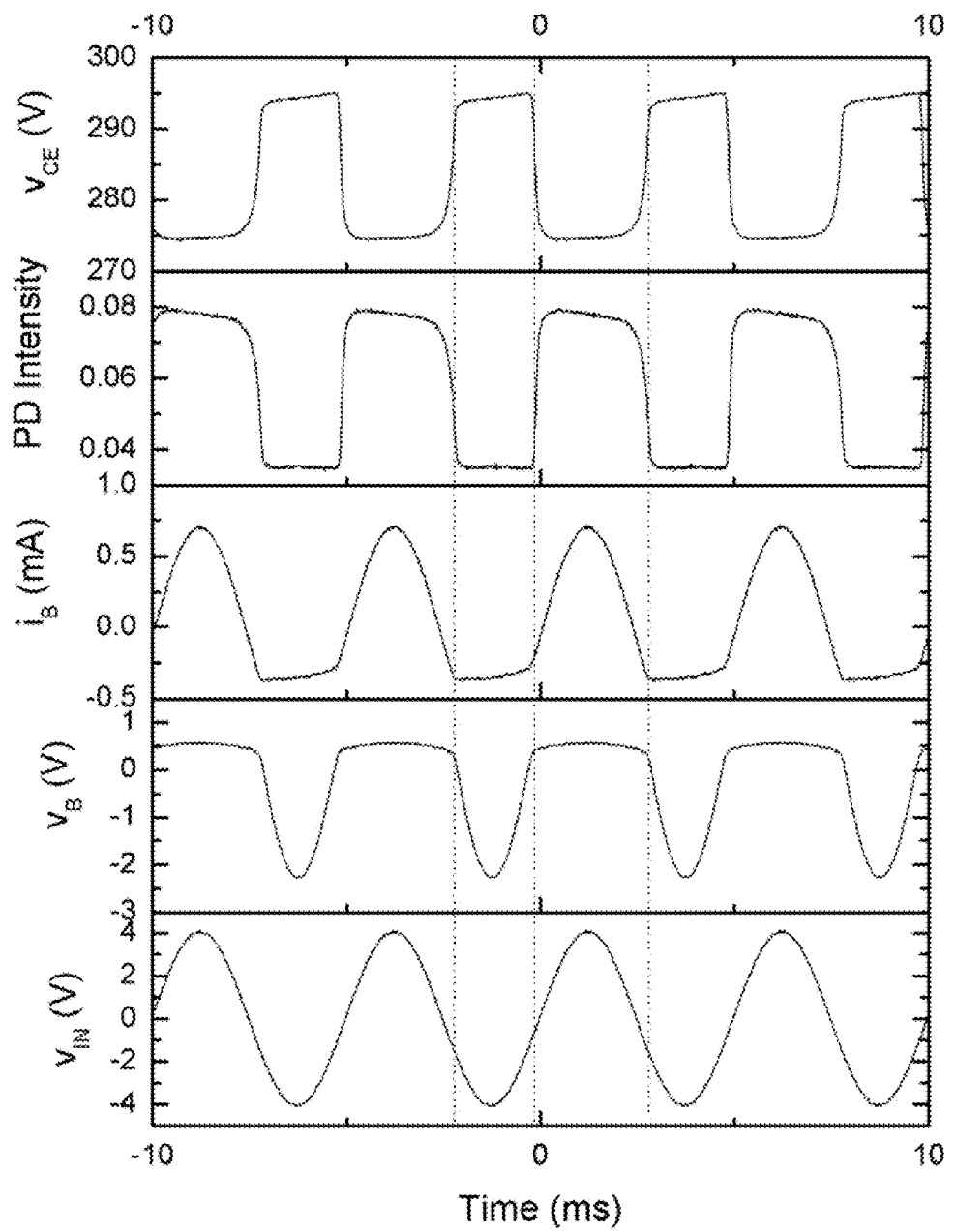
FIG. 14 presents temporal data illustrating modulation of light emission from the plasma, and voltage gain characteristics of the device of FIG. 12.

FIG. 14 shows temporal data for the same device. It can be seen from the plot that the light intensity of the plasma (labeled "PD Intensity" on the ordinate where PD is an abbreviation for "photodiode") is modulated by the base voltage. Although the plasma is not extinguished in this particular example, the light emission intensity from the plasma is modulated by approximately 55%. Also, the 8 V peak-to-peak sinusoidal voltage impressed across the emitter-base junction yields a ~20 V "swing" in $V_{CE}$. Thus, the voltage gain at the collector with respect to the base is roughly 2.5. Also, there is voltage gain at the collector with respect to the base. The device is being modulated; however, the plasma is never extinguished.

Figure 15:
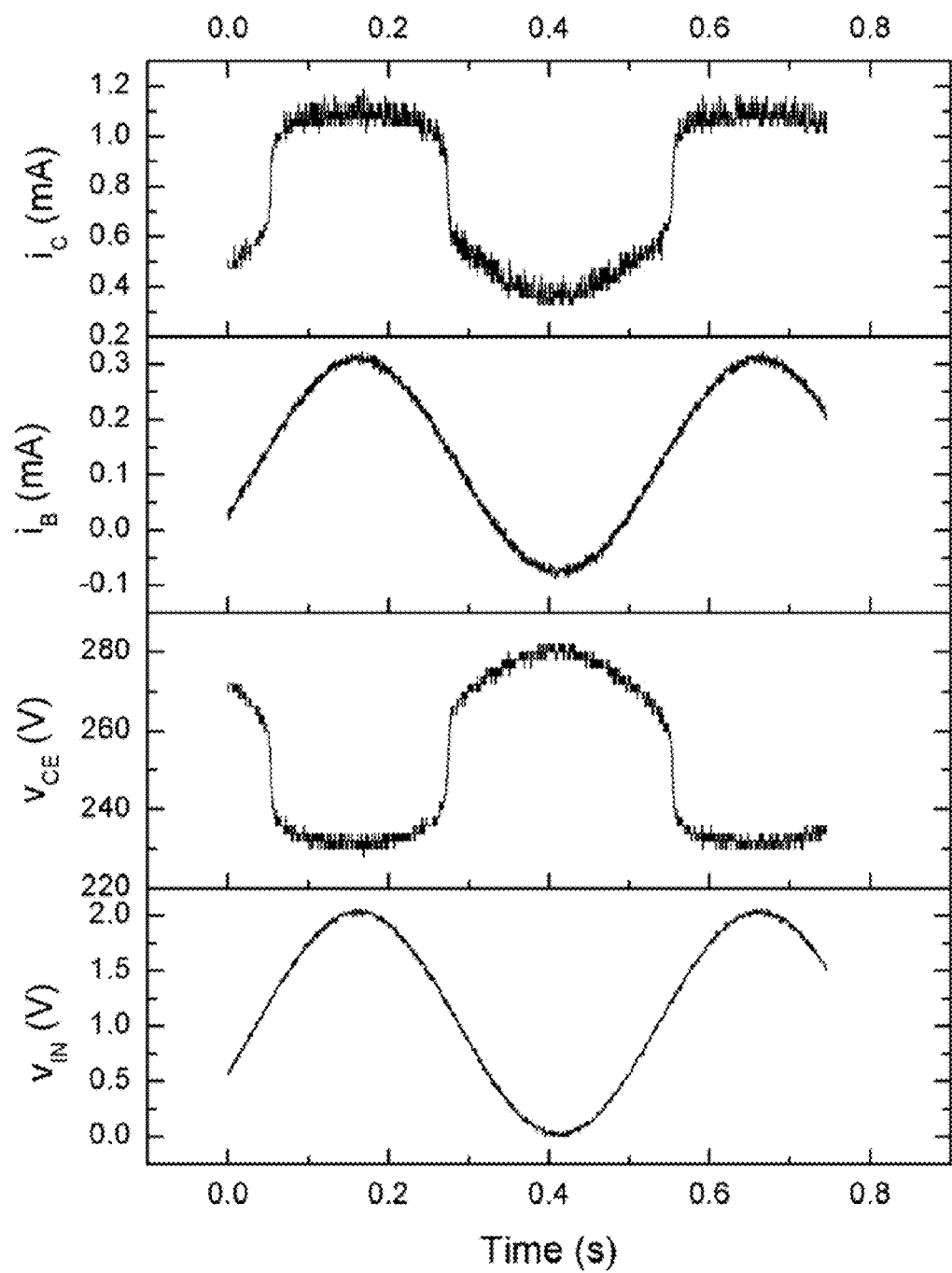
FIG. 15 shows temporal data illustrating both voltage gain and current gain in the device of FIG. 12.

FIG. 15 shows data from a similar device utilizing a sharp tip (pin) platinum electrode situated ~2 mm above the cathode. In this set of waveforms, both voltage gain and current gain in the collector (with respect to the base) is observed.

Figure 16:
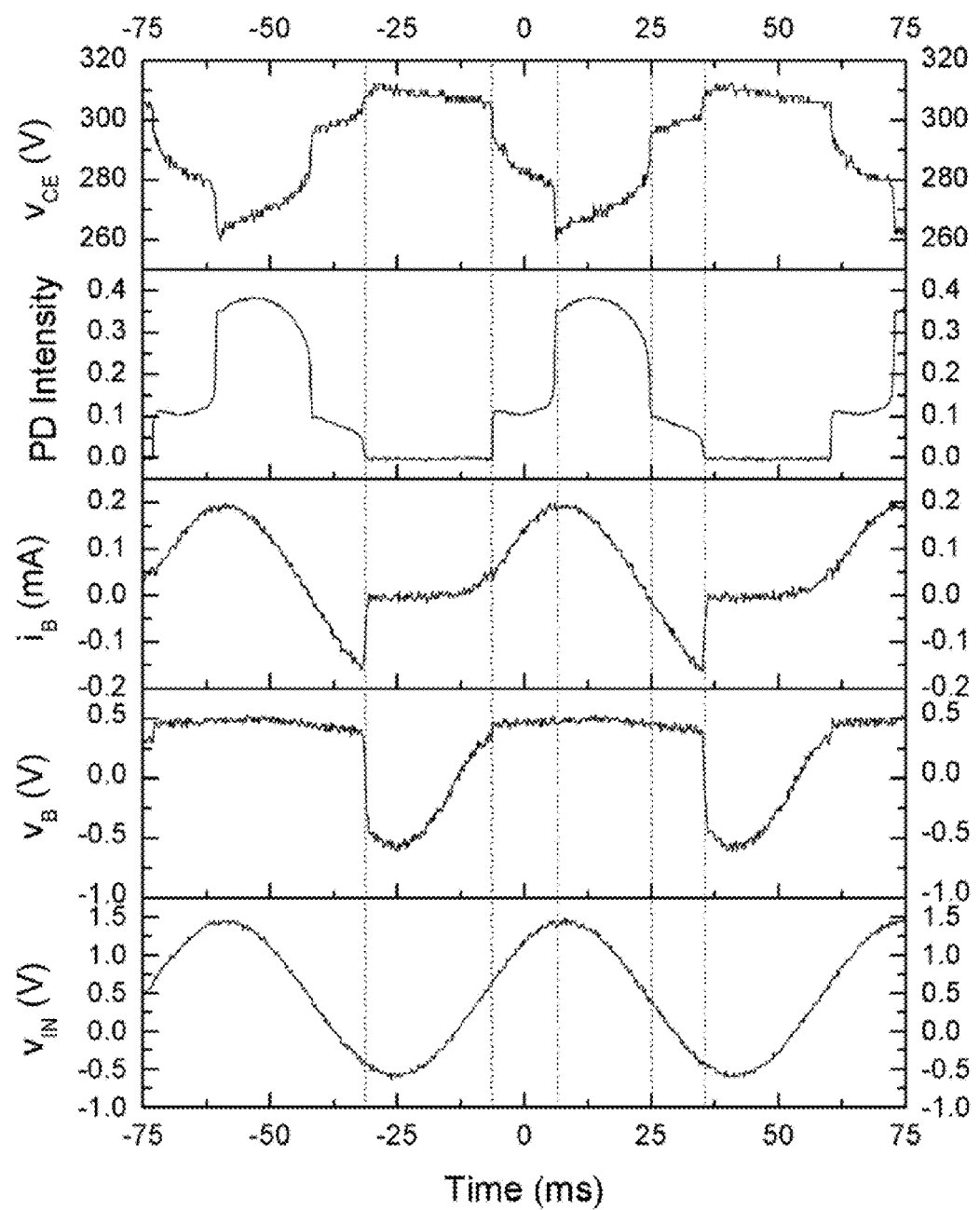
FIG. 16 presents temporal data illustrating the switching nature of the device of FIG. 12.

The data of FIG. 16 were obtained with the same npn plasma BJT that yielded the results of FIG. 15. In this situation ($V_{IN}$ varying from −0.7 V to approximately +1.5 V), the plasma is completely extinguished when $V_{IN}$ falls below −0.5 V. It is interesting to note that $i_B$ becomes negative prior to extinguishing the plasma. This is the result of photocurrent generated at the base-collector junction by light emission from the plasma, as exemplified by the return of $i_B$ to zero once the plasma is fully extinguished. Artisans will appreciate that electron-hole pairs are produced in the base, near the collector-base junction, only by photons produced by the collector that have an energy greater than the bandgap energy of the base semiconductor.

Figure 17:
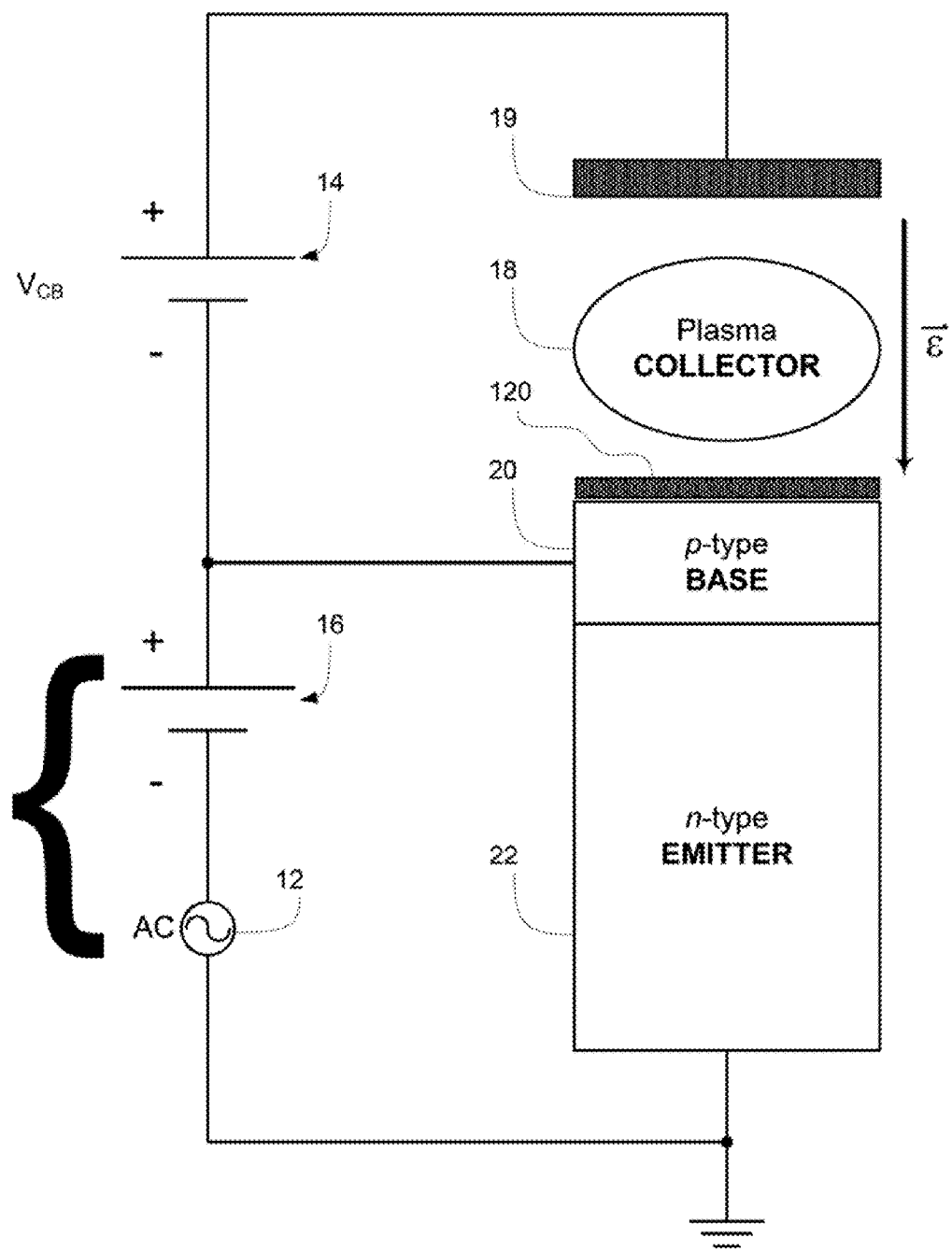
FIG. 17 is a schematic diagram of another preferred embodiment npn hybrid plasma semiconductor bipolar junction transistor in a simple external circuit.
Figure 18:
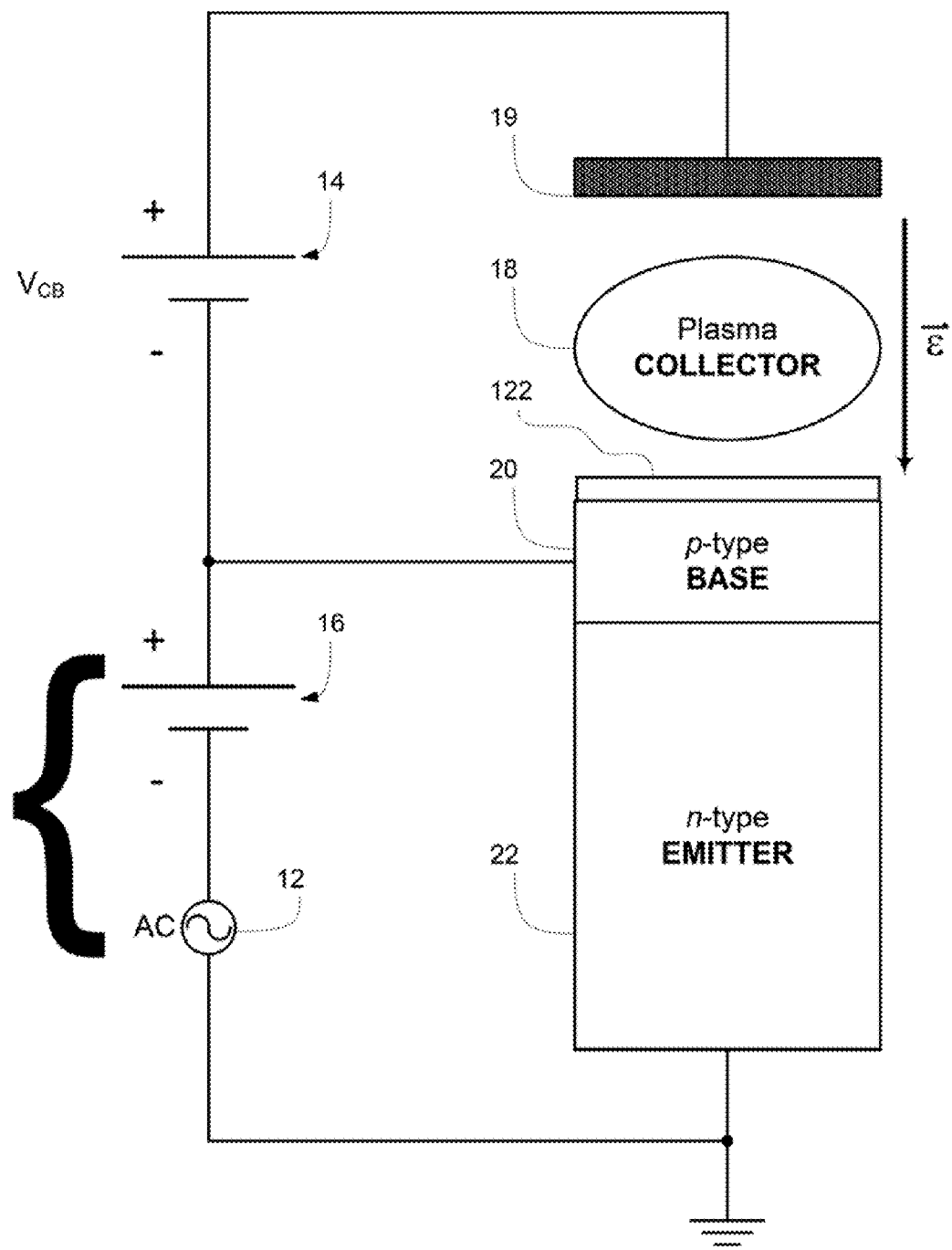
FIG. 18 is a schematic diagram of another preferred embodiment npn hybrid plasma semiconductor bipolar junction transistor in a simple external circuit.
Figure 19:
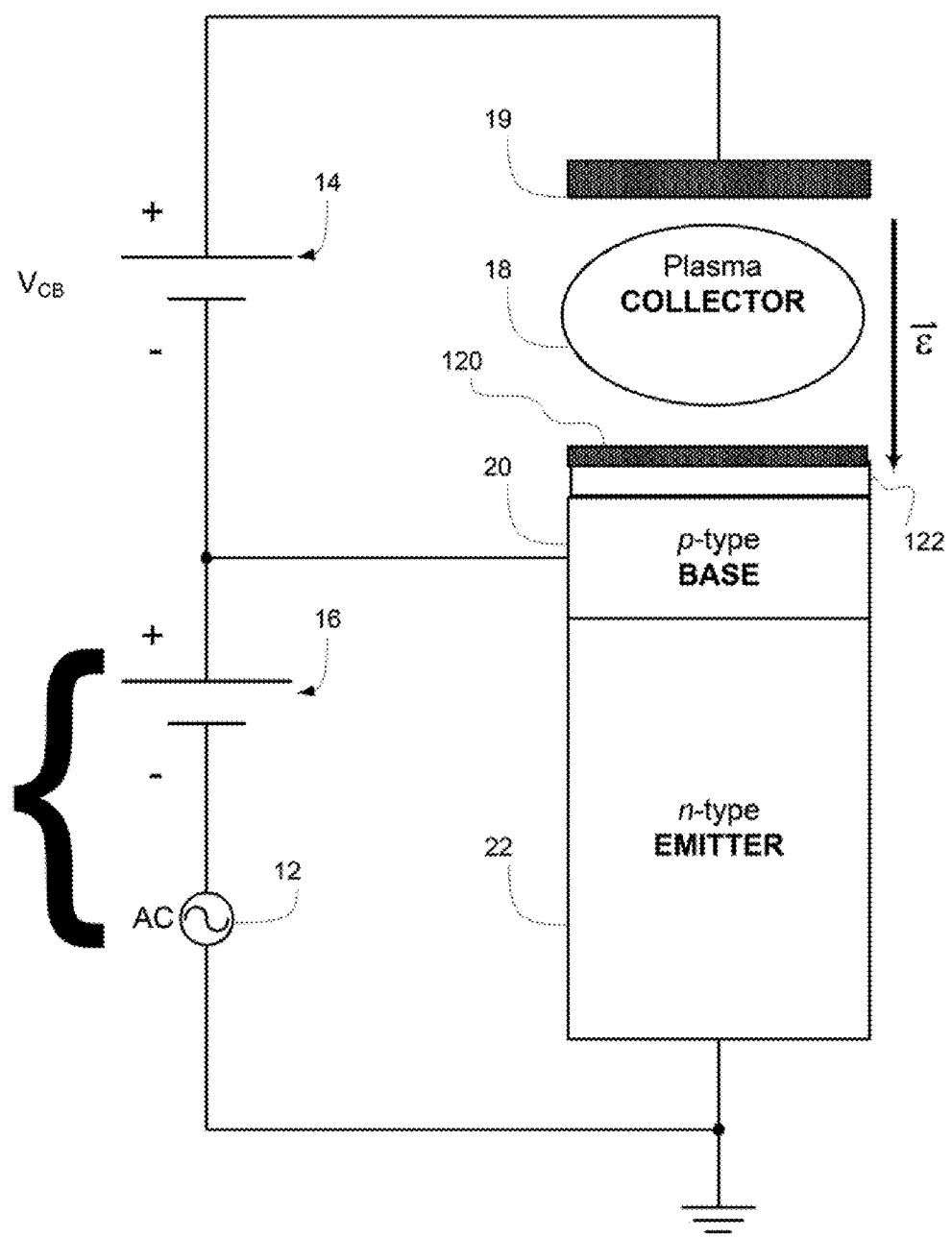
FIG. 19 is a schematic diagram of another preferred embodiment npn hybrid plasma semiconductor bipolar junction transistor in a simple external circuit.

FIGS. 17-19 show modifications of the FIG. 1 embodiment in which a thin metal cathode 120 and/or an additional n-type region 122 is added to the base. The n-type region 122, as seen in FIGS. 18 and 19, is a third semiconductor region diffused into the base 20 on the plasma side of the device. One example is a device (such as that of FIG. 18) with an n-type emitter 22, a p-type base 20, and an n-type region 122 diffused into the base on the plasma-facing side, thus forming an n-p-n-plasma device. The base-emitter junction is forward biased as before whereas the pn junction nearest to the plasma is reverse-biased. Ideally, the thickness of the top n-region 122 in FIG. 18 is less than one electron diffusion length. When the top pn junction is reverse-biased with a voltage of sufficient magnitude, electrons entering the n-type region 122 from the p-type base have greater energy than the work function of the n-type surface. In this manner, they are easily injected into the plasma. Therefore, the upper n-type region 122 can reduce the cathode fall (sheath) voltage of the plasma.

Figure 20:
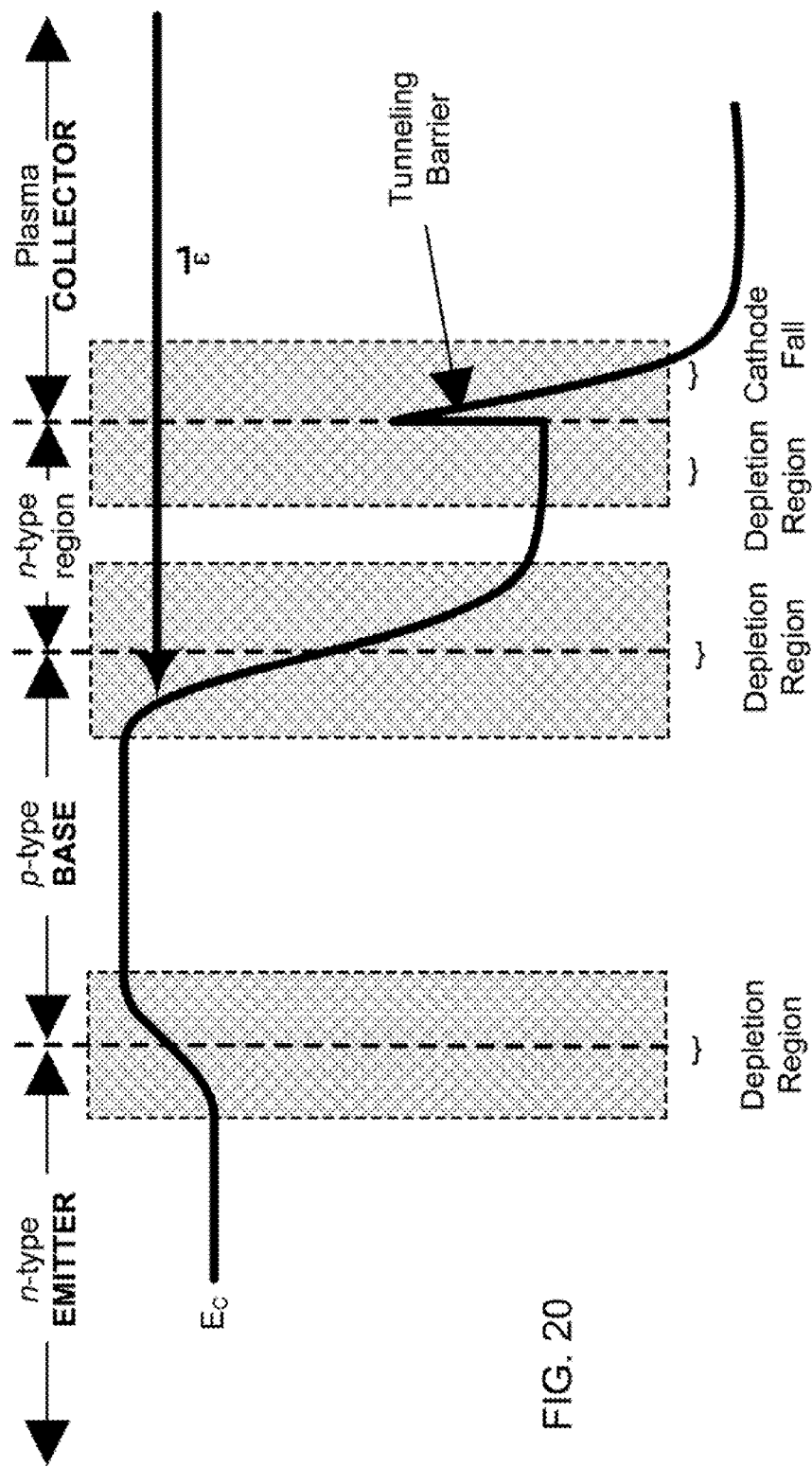
FIG. 20 is a qualitative energy band diagram for the npn hybrid plasma semiconductor transistor device of FIG. 18.

The FIGS. 17 and 19 embodiments include an additional thin conducting (metal) layer 120 facing the plasma 18. This conducting layer 120 is ideally, but not necessarily, thinner than the mean free path of the electron in the layer. The conducting layer 120, e.g., a metal layer, is able to passivate the surface of the solid state semiconductor p-type base 20 and/or reduce degradation of the surface of the solid state semiconductor while still allowing electrons to be injected into the plasma 18. In addition, the conductive layer 120 can inhibit phototransistor operation and associated positive feedback effects. The metal can occupy anywhere from a small region of the plasma cathode surface, up to as much as the entire surface. FIG. 20 illustrates qualitatively the variation of the energy of the conduction band edge ($E_C$) throughout the n-p-n-plasma BJT of FIG. 18.

Figure 21:
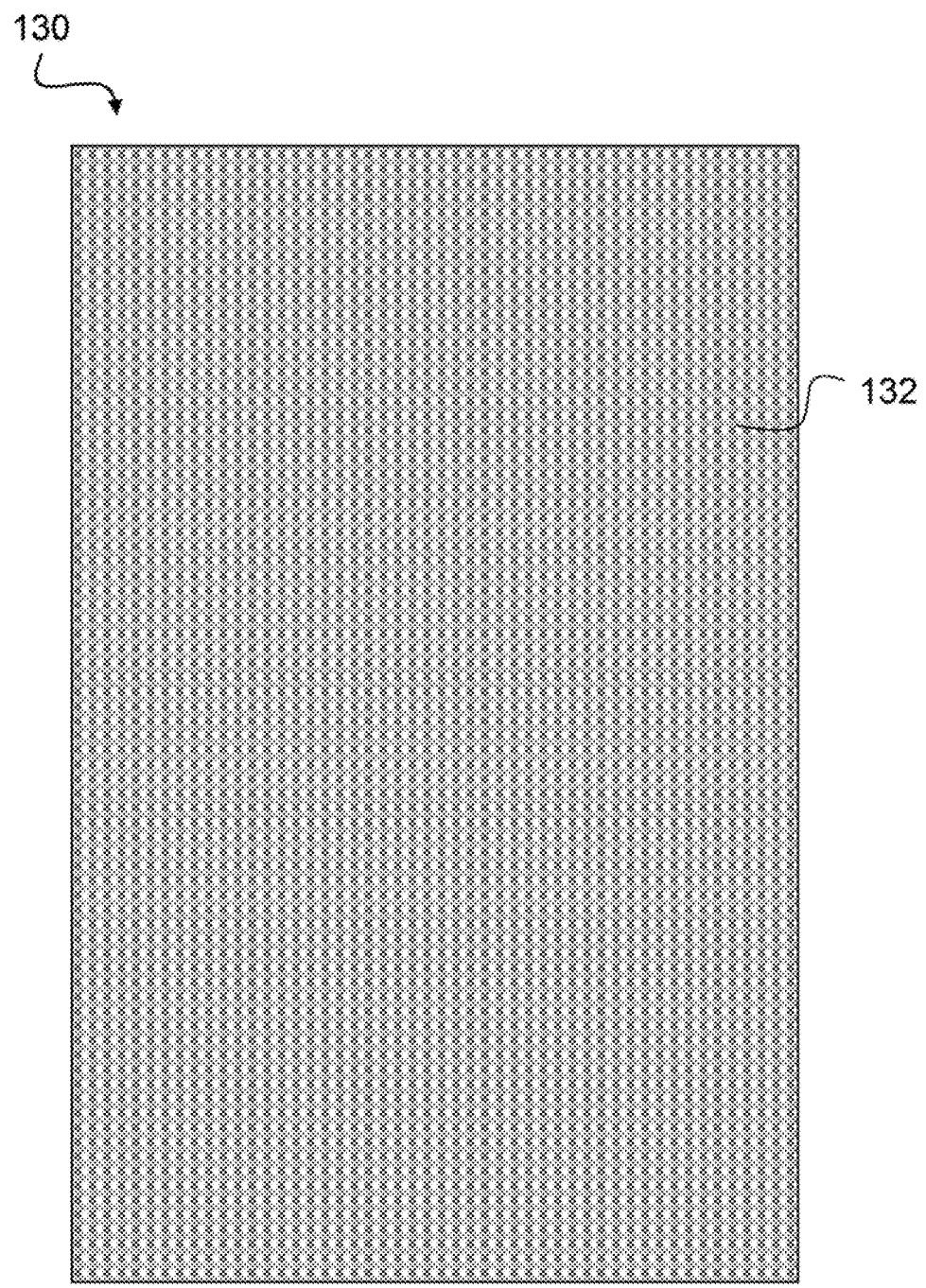
FIG. 21 is a schematic top view of an array of hybrid semiconducting devices of the invention.

Electronic circuits can be formed with pluralities of devices of the invention. Standard semiconductor fabrication techniques are capable of producing arrays of microcavities, patterns of active regions, and arrays of electrodes, etc. and are similarly capable of producing arrays of hybrid plasma/semiconductor devices of the invention for any of the above illustrated embodiments. FIG. 21 is a simple diagram illustrating an array 130 of hybrid plasma semiconducting devices 132 of the invention that can be interconnected, for example, to form complex operational circuits. Devices of the invention can be employed to replace semiconductor transistors, vacuum tubes, photodetectors and light emitters in electronic circuits such as amplifiers, switches, photodetectors, oscillators and other types of devices that will be apparent to artisans.

Although embodiments have been shown in which a plasma replaces the n-type collector of an npn BJT, it should be emphasized that a second plasma could also replace the n-type emitter. In this case, the emitter-base bias will likely be larger than that for the embodiments of FIGS. 3, 4, 6, 7, and 8, for example, in which both the emitter and base are semiconductors. However, since both the emitter and collector in the "double plasma" embodiment are plasmas and the base region thickness is less than the diffusion length of electrons, a plasma emitter (n-type)/semiconductor base (p-type)/plasma collector (n-type) BJT is expected to be able to tolerate large power loadings. Another possibility is to use a semiconductor as the collector and emitter regions, and have the plasma serve as the n-type base in a pnp plasma BJT. Finally, it should be noted that other embodiments of the invention utilize plasmas in which massive negative ions (such as I⁻) are the dominant negative charge carrier. If the dominant positive charge carrier is a light ion (such as the proton, H⁺), then the electrical characteristics of the plasma will be largely dictated by the positive ions (electronegative plasma). Thus, the plasma will resemble p-type semiconductor material and pnp plasma-semiconductor transistors can be realized. The FIG. 18 version of such a transistor would be a p-n-p-plasma device.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A hybrid plasma semiconductor device, comprising doped solid state semiconductor regions in a solid state substrate, and at least one electrode arranged with respect to said solid state substrate to generate a plasma in a plasma medium proximate said substrate and said solid state semiconductor regions in a position where the plasma will influence or perform a transistor function in cooperation with said solid state semiconductor regions, and the device comprises three transistor contacts that provide access to the transistor functions and said solid state regions and plasma are arranged such that the device provides one of bipolar junction transistor functions or field effect transistor functions, wherein said plasma medium comprises comprising gas(es), vapor(s), or a combination thereof.

2. The device of claim 1, wherein said at least one electrode comprises one of said three transistor contacts.

3. The device of claim 2, wherein said solid state semiconductor regions are arranged to firm base and emitter regions of a BJT transistor and the plasma performs a collector function.

4. The device of claim 3, wherein said plasma comprises a microplasma.

5. A hybrid plasma semiconductor device, comprising doped solid state semiconductor regions in a solid state substrate, and at least one electrode arranged with respect to said solid state substrate to generate a plasma proximate said substrate and said solid state semiconductor regions in a position where the plasma will influence or perform a semiconducting function in cooperation with said solid state semiconductor regions, wherein:

the plasma is formed in a plasma medium comprising gas(es), vapor(s), or a combination thereof, and the plasma influences or performs a transistor function in cooperation with said solid state semiconductor regions, said solid state semiconductor regions are arranged to form base and emitter regions of a BJT transistor and the plasma performs a collector function, the plasma comprises a microplasma, said solid state substrate comprises an n-type substrate defining said base region and with a microcavity therein;

said emitter region comprises a p-type region diffused into the surface of said n-type substrate that includes said microcavity; and a dielectric film to isolate said p-type region from said at least one electrode, said at least one electrode comprising an anode being formed upon said dielectric film around a circumference of said microcavity.

6. A hybrid plasma semiconductor device, comprising doped solid state semiconductor regions in a solid state substrate, and at least one electrode arranged with respect, to said solid state substrate to generate a plasma proximate said substrate and said solid state semiconductor regions in a position where the plasma will influence or perform a semiconducting function in cooperation with said solid state semiconductor regions, wherein:

the plasma influences or performs a transistor function in cooperation with said solid state semiconductor regions, said solid state semiconductor regions are arranged to form base and emitter regions of a BJT transistor and the plasma performs a collector function, the plasma comprises a microplasma, said base region comprises a first p-type layer;

said emitter region comprises a n-type region diffused into a first side of said p-type layer; the device further comprising, a second semiconductor layer isolated from said first p-type layer on a second side of said first p-type layer;

a microcavity defined in said second semiconductor layer to contain the plasma therein.

7. The device of claim 6, wherein said at least one electrode comprises an anode contacting said second semiconductor layer, the device further comprising base and emitter contacts to said base and emitter regions and a dielectric film to isolate said base contact from said emitter region and said emitter contact from said base region.

8. The device of claim 6, wherein said at least one electrode comprises an anode disposed across from said microcavity.

9. The device of claim 8, further comprising a dielectric film isolating said second semiconductor layer from said microcavity.

10. A hybrid plasma semiconductor device, comprising doped solid state semiconductor regions in a solid state substrate, and at least one electrode arranged with respect to said solid state substrate to generate a plasma proximate said substrate and said solid state semiconductor regions in a position where the plasma will influence or perform a semiconducting function in cooperation with said solid state semiconductor regions, wherein:

the plasma influences or performs a transistor function in cooperation with said solid state semiconductor regions, said solid state semiconductor regions are arranged to form base and emitter regions of a BJT transistor and the plasma performs a collector function, the plasma comprises a microplasma, said base region comprises a first p-type layer;

there is an exposed area of said base region on a first side of said first p-type layer;

said emitter region comprises a-type region diffused into a second side of said p-type layer;

said at least one electrode comprises an anode disposed opposite said exposed area of said base region, the device further comprising emitter and base contacts to said emitter and base regions.

11. The device of claim 3, further comprising an enclosure for containing a plasma medium.

12. A hybrid plasma semiconducting transistor device comprising a plurality of active semiconductor regions, at least one of said active regions being a microplasma region that forms a microplasma semiconductor to serve as one of said active regions in response to an appropriate electric field, and at least one of the other of said plurality of active semiconductor regions being formed by solid state semiconductor material, and three transistor contacts that provide access to the transistor function provided by said active semiconductor.

13. The device of claim 12, wherein said plurality of active semiconductor regions comprise n, p, and n regions, at least one of said n, p and n regions being formed by the plasma and at least one other one of said n, p and n regions being formed by a solid state semiconductor material.

14. A hybrid plasma semiconducting device comprising a plurality of active semiconductor regions, at least one of said active regions being a plasma or influence by a plasma, and at least one of the other of said plurality of active semiconductor regions being formed by solid state semiconductor material, wherein said plurality of active semiconductor regions comprise n, p, and n regions, at least one of said n, p and a regions being formed by the plasma and at least one other one of said n, p and n regions being formed by a solid state semiconductor material, said plasma comprises a microplasma formed in a microcavity, and said plurality of active semiconductor regions comprise:

an n-type silicon substrate, said microcavity penetrates said silicon substrate;

thin p-type solid state material disposed between the microcavity and the n-type silicon substrate, said n-type silicon substrate, microcavity and thin p-type solid state material are arranged to operate as a bipolar junction transistor when a microplasma is generated within the microcavity with the microplasma forming a collector region of the bipolar junction transistor.

15. The device of claim 14, wherein said microcavity has a diameter of less than about 500 µm.

16. The device of claim 15, wherein said microcavity has a diameter of less than about 100 µm.

17. The device of claim 16, wherein said microcavity has a diameter of less than about 10 µm.

18. An electronic circuit, comprising a plurality of devices of claim 12.

19. A hybrid plasma transistor device, comprising:

two active solid state semiconductor regions; and a microplasma region that supports plasma generated in proximity to the active solid state semiconductor regions, wherein the plasma services as a third semiconductor region of the transistor device when generated in response to an applied electric field.

20. The device of claim 19, wherein said active solid state semiconductor regions comprise a plurality of junctions formed from first and second solid state semiconductor materials or differently doped regions.

21. The device of claim 20, wherein said solid state semiconductor regions comprise negative electron affinity (NEA) materials.

22. A hybrid semiconductor device, comprising:
solid state semiconductor means for performing semiconducting operations of a MOSFET or a BJT; and
plasma generation, means for generating plasma in a plasma medium in proximity to said solid state semiconductor means to perform a semiconducting operation of the BJT or influence a semiconducting operation of the MOSFET, wherein said plasma medium comprises comprising gas(es), vapor(s), or a combination thereof.

\* \* \* \* \*

UNITED STATES PATENT AND TRADEMARK OFFICE
CERTIFICATE OF CORRECTION

PATENT NO. : 8,525,276 B2  
APPLICATION NO. : 12/817551  
DATED : September 3, 2013  
INVENTOR(S) : Paul C. Tchertchian et al.

Page 1 of 1

It is certified that error appears in the above-identified patent and that said Letters Patent is hereby corrected as shown below:

In the Specification

Column 5, Line 24     After "dimensions" please delete "$d \geqq 1$" and insert -- $d \geq 1$ -- therefor.

In the Claims

Column 12, Line 49  
Claim 1     Before "transistor" please delete "unction" and insert -- junction -- therefor.

Column 12, Line 56  
Claim 3     Before "base" please delete "firm" and insert -- form -- therefor.

Column 14, Line 1  
Claim 10     Before "region" please delete "a-type" and insert -- $n - type$ -- therefor.

Column 14, Line 30  
Claim 14     Please delete "a regions" and insert -- n regions -- therefor.

Column 14, Line 65  
Claim 21     After "claim" please delete "20" and insert -- 19 -- therefor.

Signed and Sealed this  
Tenth Day of April, 2018

Andrei Iancu  
*Director of the United States Patent and Trademark Office*